(12) United States Patent  (10) Patent No.: US 8,580,130 B2
Mao et al.  (45) Date of Patent: Nov. 12, 2013

(54) LASER-ASSISTED NANOMATERIAL DEPOSITION, NANOMANUFACTURING, IN SITU MONITORING AND ASSOCIATED APPARATUS

(75) Inventors: Samuel S. Mao, Castro Valley, CA (US); Costas P. Grigoropoulos, Berkeley, CA (US); David J. Hwang, El Cerrito, CA (US); Andrew M. Minor, El Cerrito, CA (US)

(73) Assignee: The Regents of the University of California, Oakland, CA (US)

( * ) Notice: Subject to any disclaimer, the term of this patent is extended or adjusted under 35 U.S.C. 154(b) by 489 days.

(21) Appl. No.: 12/743,550

(22) PCT Filed: Dec. 16, 2008

(86) PCT No.: PCT/US2008/087027
§ 371 (c)(1),
(2), (4) Date: Jul. 22, 2010

(87) PCT Pub. No.: WO2009/085772
PCT Pub. Date: Jul. 9, 2009

(65) Prior Publication Data
US 2010/0320171 A1  Dec. 23, 2010

Related U.S. Application Data

(60) Provisional application No. 61/015,456, filed on Dec. 20, 2007.

(51) Int. Cl.
*B44C 1/22* (2006.01)
(52) U.S. Cl.
USPC .............. 216/65; 216/62; 216/66; 250/341.1; 156/340.4

(58) Field of Classification Search
USPC ............ 216/62, 65, 66, 72, 73; 436/161, 164, 436/171; 250/341.1; 156/345.4
See application file for complete search history.

(56) References Cited

U.S. PATENT DOCUMENTS

| 7,767,272 B2* | 8/2010 | Liu et al. ..................... 427/554 |
| 2005/0016954 A1* | 1/2005 | Hamann et al. ................ 216/62 |
| 2005/0153145 A1* | 7/2005 | Yamashita et al. ............ 428/447 |
| 2007/0047898 A1* | 3/2007 | Cheng ........................... 385/147 |

OTHER PUBLICATIONS

Mao, Samuel S., "Nanolasers: Lasing from nanoscale quantum wires", Int. J. of Nanotechnology, vol. 1, Nos. 1-2, 2004.
Huang et al., "Room-temperature ultraviolet nanowire nanolasers", Science, vol. 292, Jun. 8, 2001, pp. 1897-1899.

* cited by examiner

*Primary Examiner* — Lan Vinh
(74) *Attorney, Agent, or Firm* — Weaver Austin Villeneuve & Sampson LLP

(57) ABSTRACT

Laser-assisted apparatus and methods for performing nanoscale material processing, including nanodeposition of materials, can be controlled very precisely to yield both simple and complex structures with sizes less than 100 nm. Optical or thermal energy in the near field of a photon (laser) pulse is used to fabricate submicron and nanometer structures on a substrate. A wide variety of laser material processing techniques can be adapted for use including, subtractive (e.g., ablation, machining or chemical etching), additive (e.g., chemical vapor deposition, selective self-assembly), and modification (e.g., phase transformation, doping) processes. Additionally, the apparatus can be integrated into imaging instruments, such as SEM and TEM, to allow for real-time imaging of the material processing.

22 Claims, 18 Drawing Sheets

LASER-ASSISTED NANOMATERIAL DEPOSITION, NANOMANUFACTURING, IN SITU MONITORING AND ASSOCIATED APPARATUS

CROSS-REFERENCE TO RELATED APPLICATIONS

This application claims priority to U.S. Provisional Patent Application No. 61/015,456, titled LASER-ASSISTED NANOMATERIAL DEPOSITION, NANOMANUFACTURING AND IN-SITU MONITORING, filed Dec. 20, 2007, the disclosure of which is incorporated herein by reference in its entirety and for all purposes.

STATEMENT OF GOVERNMENTAL SUPPORT

The invention described and claimed herein was made in part utilizing funds supplied by the U.S. Department of Energy under Contract Number DE-AC02-05CH11231. The government has certain rights in this invention.

BACKGROUND OF THE INVENTION

1. Field of the Invention

This invention relates generally to apparatus and methods of laser-assisted nanomanufacturing such as nanoscale machining, phase transformation, chemical reaction mediated processes (chemical vapor deposition or chemical etching) on the nanoscale using small probes and laser radiation. In particular, in some aspects the invention relates to laser-assisted nanomanufacturing and in situ monitoring methods and systems based on coupled optical near-fields to investigate nanoscale light-nanomaterials interactions.

2. Related Art

Traditional methods of material processing at the sub-micron scale involve indirect, multi-step processes that result in high manufacturing cost. The only direct-write technologies currently available are electron and ion beam writing. However, the minimum feature size for these methods is limited by the interaction volume of the incident electron or ion beams with the sample. Even though an electron beam can be focused to a spot of less than 1 nm for beam writing, the resulting scattering of the irradiated electrons and emission of secondary electrons from the sample leads to additional distribution of processed material on the order of 100 nm. Thus the minimum feature size achievable in direct-write methods is about 100 nm, too large for semiconductor industry needs. Currently, in order to achieve truly nanometer-scale device features, the semiconductor industry can use electron lithography. The minimum achievable line width of electron lithography has been shown to be about 10 nm. However, as with all lithographic processes, electron lithography has the disadvantage that it is an indirect process, and it is not possible to address individual structures easily. Furthermore, electron-beam, ion-beam, and imprinting technologies lack the flexibility to form three-dimensional nanostructures. Nanofabrication of complex two- or three-dimensional structures cannot be readily accomplished Traditional electron microscopy techniques such as SEM and TEM have been adapted for nanoscale inspection (see, e.g., David C. Joy, Alton D. Romig, Joseph Goldstein, Principles of Analytical Electron Microscopy by Springer, 1986). In situ monitoring capabilities have also been demonstrated based on substrate heating, electric bias and/or a controlled gas environment. To date, nanoscale localization of events has been achieved by using a sharp tip inside the electron microscope. For example, as reported by Goldberg et al., In situ electrical probing and bias-mediated manipulation of dielectric nanotubes in a high-resolution transmission electron microscope, Appl. Phys. Lett., Vol. 88, 123101, 2006, an electrically biased tip has been used to localize and control carbon nanotube growth.

Near-field optics is that branch of optics that considers configurations that depend on the passage of light to, from, through, or near an element with subwavelength features and the coupling of that light to a second element located a subwavelength distance from the first. The barrier of spatial resolution imposed by the very nature of light itself in conventional optical microscopy contributed significantly to the development of near-field optical devices, most notably the near-field scanning optical microscope, or NSOM. The limit of optical resolution in a conventional microscope, the so-called diffraction limit, is on the order of half the wavelength of the light used to image. Thus, when imaging at visible wavelengths the smallest resolvable objects are several hundred nanometers in size. Using near-field optical techniques, researchers currently resolve features on the order of tens of nanometers in size. While other imaging techniques (e.g. atomic force microscopy and electron microscopy) can resolve features of much smaller size, the many advantages of optical microscopy make near-field optics a field of considerable interest.

SUMMARY

The present invention provides laser-assisted apparatus and methods for performing nanoscale material processing, including nanodeposition of materials. The apparatus and processes can be controlled very precisely to yield both simple and complex structures with sizes less than 100 nm. Optical or thermal energy in the near field of a photon (laser) pulse is used to fabricate submicron and nanometer structures on a substrate. A wide variety of laser material processing techniques can be adapted for use including, subtractive (e.g., ablation, machining or chemical etching), additive (e.g., chemical vapor deposition, selective self-assembly), and modification (e.g., phase transformation, doping) processes. Additionally, the apparatus can be integrated into imaging instruments, such as SEM and TEM, to allow for real-time imaging of the material processing.

In one aspect, the invention relates to a method for performing nanoscale material processing of a material target. The method involves providing a target; providing a laser configured to produce laser radiation having a wavelength; providing a probe less than one wavelength away from the target in a near field region; using the laser to provide a laser radiation pulse to the probe, thus causing the probe to emit energy; and allowing the energy emitted from the probe to interact with one or more of the target and precursor molecules provided between the probe on the target, such that the target is processed.

When, for example, the material processing includes a method for depositing material onto a target, the process can involve providing a target; providing a laser configured to produce laser radiation having a wavelength; providing a probe less than one wavelength away from the target in a near field region; providing precursor molecules between the probe and the target; using the laser to provide a laser radiation pulse to the probe, thus causing the probe to emit energy; allowing the precursor molecules to interact with the energy emitted from the probe; and dissociating the precursor molecules in the near field region, thus depositing material onto the target. Other material processing techniques, including other additive process, and subtractive and modification processes, in the context of the present invention are also provided.

In another aspect, the invention relates to a system for performing nanoscale material processing of a material target. The system includes a NSOM probe in a vacuum chamber, the probe having a sharp tip; a laser having a wavelength configured to provide radiation in communication with the probe; and the system configured to position the probe less than one wavelength away from a target in the chamber in a near field region. The system may, for example, be configured for nanoscale material deposition. Such a system for making a nanostructure on a substrate can include a NSOM probe in a vacuum chamber, the probe having a sharp tip; a laser configured to provide radiation in communication with the probe; a gas line for introducing precursor gas to the vacuum chamber.

These and other aspects of the present invention are described in more detail in the description that follows.

BRIEF DESCRIPTION OF THE DRAWINGS

FIG. 4b is a plot of the AFM probe height as a function of position on the sample for the deposition described with reference to FIG. 4a.

FIG. 5c is a Pt EDX (energy dispersive x-ray spectroscopy) map that shows Pt nanostructures that have been deposited using an integrated SEM/FIB system, as shown in FIG. 5a.

FIGS. 12a and 12b show the nanowire damage after about 100 laser shots (12a), and after an additional about 100 laser shots (12b). FIG. 12c depicts an in situ magnified image of FIG. 12b.

DETAILED DESCRIPTION OF SPECIFIC EMBODIMENTS

Figure 1A:
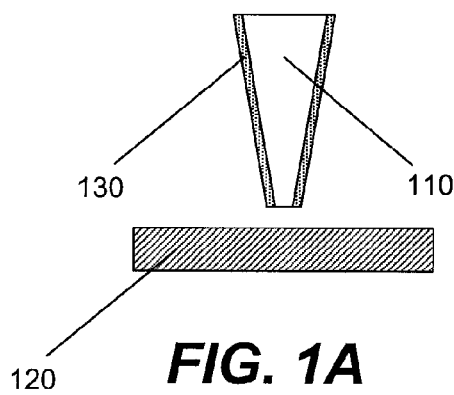
FIGS. 1a-d illustrate probe tip designs for NSOM-based devices in accordance with various embodiments of the present invention.

Reference will now be made in detail to specific embodiments of the invention. Examples of the specific embodiments are illustrated in the accompanying drawings. While the invention will be described in conjunction with these specific embodiments, it will be understood that it is not intended to limit the invention to such specific embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order to not unnecessarily obscure the present invention.

Introduction

This invention relates primarily to tip-enacted and controlled materials modification and directed synthesis at the nanometric level, as assisted by pulsed laser irradiation. A wide variety of laser material processing techniques can be adapted for use in accordance with the invention. These include: subtractive (e.g., ablation, machining or chemical etching); additive (e.g., chemical vapor deposition, selective self-assembly); and modification (e.g., phase transformation, doping) processes. The mechanisms of these processes are well known, but that the invention provides the ability to control the processing very precisely through application of near-filed optics to yield both simple and complex structures with sizes less than 100 nm. Electromagnetic (e.g., optical or possible thermal) energy in the near field of a photon (light and/or laser) pulse is used to induce the target processing to fabricate submicron and nanometer structures onto a substrate. Sub-100 nm processing resolution has been demonstrated for subtractive, additive and local modification applications. Embodiments of the invention provide both apparatus and methods for performing nano-processing of materials.

Advantages of laser radiation delivered in accordance with the present invention include a) efficient delivery of highly localized energy for excitation of an interaction tip or tip arrays, b) laser wavelength can be selected for optimal matching to the material characteristics, c) different pulse length scales from continuous wave to ultrashort enable excellent control of the thermal and stress field loading, and d) ability to induce extremely localized nonlinear atomic, chemical, structural modification and phase change transformations that may develop far from equilibrium, allowing the synthesis of novel materials.

In some arrangements complex nanostructures can be made by moving the apparatus during the material processing thus continuously processing a material along the path of the apparatus. The apparatus uses laser radiation to focus the processing to very small regions, on the order of 100 nm or less.

In one embodiment of the invention, a probe is an optical glass fiber or any thin linear material through which laser radiation can pass. The probe can be tapered or not. The width of the probe at the tip can be on the sub-micron scale. In some arrangements, the tip of the probe comes to a sharp point. In some arrangements, the probe has an additional focusing element at the tip. In some arrangements, the probe can be coated with a reflective material to reflect the laser radiation back toward the centerline of the probe and thus reduce radiation loss. The tip of the probe can be coated, thereby forming an apertureless tip, or uncoated, thereby forming an aperture.

An example of one such probe is shown in FIG. 1a, where a tapered optical glass fiber 110 is positioned adjacent a sample 120. The fiber 110 is coated on its sides, but not on its tip with a metal layer 130, so that an aperture is formed. In one arrangement the width of the probe tip is between about 200 and 800 nm. In another arrangement the width of the probe tip is between about 50 and 200 nm. The spatial extent of the near-field intensity distribution in this case scales with the aperture while the overall transmission efficiency depends on the probe geometry and materials. A plasmonic guide can also be integrated into the micro-machined probe head by determining optimum design parameters related to probe geometry and the tip's metal coating layer in order to improve light confinement at higher local intensity. Related structural and fabrication information for such a device is found in Ohtsu, M., Kobayashi, K., Kawazoe, T., Sangu, S., Yatsui, T., "Nanophotonics: design, fabrication, and operation of nanometric devices using optical near fields," *IEEE J. Seleced Topics Quantum Electronics*, Vol. 8, 839, (2002); Yatsui T, Kourogi M, Ohtsu M, "Plasmon waveguide for optical far/near-field conversion," *Applied Physics Letters*, Vol. 79, 4583 (2001), incorporated herein by reference.

When such a sub-micron optical probe tip is positioned a distance less than a single wavelength of the light (that is, in the optical near-field) from a sample and light is transmitted through the tip (aperture) of the probe, nanometer spatial resolution can be achieved. This phenomenon, known as near-field optics, enables non-diffraction limited imaging and spectroscopy of a sample that is simply not possible with conventional optical imaging techniques, which are subject to diffraction limitations on the order of the wavelength of the incident light. Within the optical near-field region, the emerging light is not diffraction limited and nanometer spatial resolution is possible.

It is known that in near-field scanning optical microscopy (NSOM) a sub-wavelength light source is used with a scanning probe. A tapered optical fiber is used as the probe. An aperture at the end of the optical fiber is scanned over and at a distance of just a few nanometers from the surface to be imaged. By illuminating a sample with the optical near-field of a small light source, optical images with resolution well beyond the usual diffraction limit (typically around 50 nm) can be made.

Figure 1B:
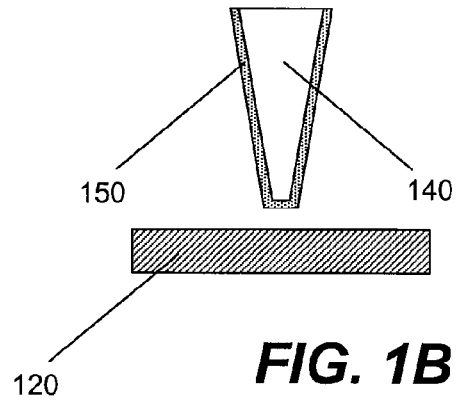

In another embodiment of the invention, a different sort of probe is exposed to laser radiation from outside the probe. While the invention is not limited to any particular theory of operation, it is believed that the tip-end behaves as a long-wire antenna that redistributes the radiative laser energy to a confined nanometric domain, while intensity enhancement via shorter laser wavelengths is attributed to tip-induced plasmons. The extended probe surface acts as a collector of incident laser electromagnetic radiation that is then concentrated and emitted at the sharp tip of the probe under extremely tight confinement. The enhancement depends on the tip geometry and material, the tip-sample separation and the optical properties of the sample. The smaller the radius of curvature at the tip, the greater is the concentration of the energy. In some arrangements, the field at the tip of the probe can be enhanced further by applying a bias voltage between the sample and the tip. In some instances, the laser beam intensity can be confined to a domain of a few tens of nm. According to this embodiment, the probe can be made of semiconductor materials (e.g., silicon), metals (e.g., tungsten) or a material that is transparent to the laser radiation (e.g., silicon nitride) and coated with a metal such as gold or silver. An example of such a probe is shown in FIG. 1b, where a tapered probe 140 is positioned adjacent a sample 120. The probe 140 is coated on its sides and on its tip with a metal layer 150.

Figure 1C:
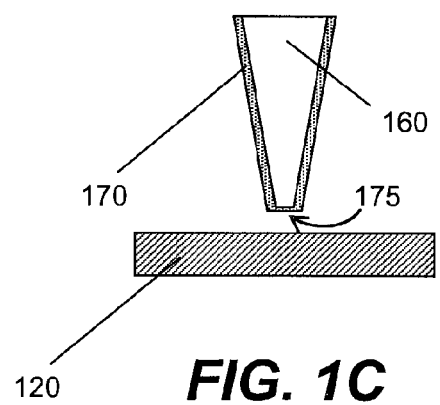
Figure 1D:
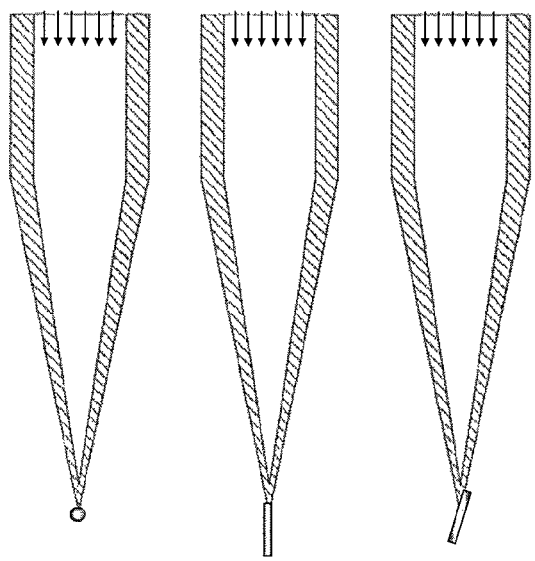

In another embodiment of the invention, a probe can be optical glass fiber or any thin linear material through which laser radiation can pass and coated with a metal such as gold or silver. The tip of the probe is either uncoated or coated with a thin metal layer so that laser radiation can mainly excite the metal layer and a re-emitted electric field from the tip in evanescent wave form indirectly reaches an adjacent sample. The tip described above with reference to FIG. 1a can function in this manner. Another such probe of this type is shown in FIG. 1c where a tapered optical glass fiber 160 is positioned adjacent a sample 120. The fiber 160 is coated with a metal layer 170 on its sides. There is a thinner, laser transmissive metal layer 175 on its tip. Such a probe can be used with laser radiation both traveling through the probe and incident on the outside of the probe to gain the benefits of both the near-field optical effects and the enhanced-field plasmon effects described above. When the tip end radius is reduced to nanometric scale, the probe shown in FIG. 1c approaches the geometry of the probe shown in FIG. 1b. This configuration has the advantage of easier laser coupling compared to the external illumination configuration. Another advantage of this configuration is in that laser radiation can be coupled from the top rather than from side of the tip array at almost grazing angle. This facilitates integration of the laser beam, especially in reactive chemical environments, and reduces the risk of unwanted direct illumination onto the sample. To this end, nanostructure attached probes (FIG. 1d) can be implemented for further enhancement of the spatial resolution.

The material processing aspects of the invention include nanoscale laser-assisted chemical deposition (LCVD) and nanostructure fabrication. Two important components of the deposition aspect of this invention are (1) Deposition and writing of growth-catalyzing nanometric features via an NSOM-LCVD process, and (2) Controlled crystal growth and fabrication of complex nanostructures in three dimensions. LCVD is an extremely versatile materials synthesis technique that enables the formation of technologically attractive microstructures of well-defined dimensions in a single-step process. A number of applications are described and envisioned, including the fabrication of contacts, circuit lines, interconnects and the repair of lithographic masks. LCVD also offers unique capabilities for the formation, coating, and patterning of non-planar, 3-dimensional objects. The decomposition of precursor molecules in LCVD can be activated either thermally (pyrolytic LCVD) or non-thermally (photolytic LCVD), or by a combination of both (i.e. photophysical LCVD). Major advantages of pyrolytic LCVD are the synthesis of high-purity materials and fast deposition rates, but an obvious drawback is that it cannot be used if the substrate softens or melts prior to gas decomposition upon exposure to laser radiation. Photolytic LCVD can be used for deposition on fragile substrates, including organic materials. Which mechanism is dominant in the deposition depends on many variables including laser wavelength and the molecular bands in the precursor molecules.

It can be useful to consider the substrate material and the material to be deposited before deciding which deposition mechanism to use. Pyrolysis involves heating to temperatures that can melt some substrates, whereas photolysis involves only negligible heating. Photolytic LCVD can be used for deposition on fragile substrates, including organic materials. Precursor gases that work well with pyrolitic LCVD include halogen compounds, hydrocarbons, and silanes. In general, molecules that have electronic transitions in the UV or deep UV range can be used in pyrolytic LCVD. Precursor gases that work well with photolytic and photophysical LCVD include alkyls, carbonyls, and organometallic complexes. In general, molecules that have electronic transitions in visible (VIS) or ultraviolet (UV) wavelengths can be used in photolytic and photophysical LCVD.

Implementation involves integration of NSOM-based processing in an environment of processing gases for photochemically assisted deposition at nanometer scale. Unlike other routes for nanostructure synthesis, assembly or other processing, this method enables the integration a variety of nanostructures made from a wide range of materials on a single substrate thus creating assemblies of unprecedented functionality. High intensity UV laser radiation can initiate thermal chemistry; or alternatively, if the pyrolytic laser source is in the VIS or near-UV, photodissocation of weakly bounded complexes may occur. Selection of precursor material, or parent gas, is instrumental in developing a viable nanodeposition process.

Figure 1E:
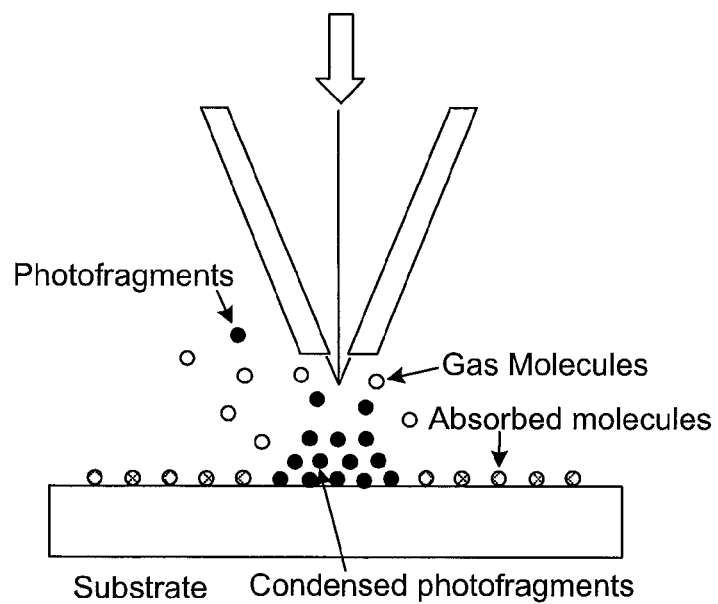
FIG. 1e illustrates a probe tip in a conceptual deposition operation in accordance with an embodiment of the present invention.

In this case of a deposition operation, as a parent gas (e.g., silane for Si deposition)/carrier gas mixture flows into the process chamber, gas molecules impinging on the substrate—some of which are physisorbed—are selectively exposed to laser radiation using the NSOM technique. The induced temperature distribution will cause thermal dissociation of gas molecules at or near the surface, which can then form stable nuclei. In the case of transparent substrates, nucleation can be initiated by the atomic products of adsorbed molecules dissociated by the laser beam radiation. A fraction of photofragments created by gas-phase dissociation within the optical near-field emitted by the NSOM will condense preferentially on the nuclei generated within the irradiated area. This process is illustrated in FIG. 1e.

Parent gas molecules not directly exposed to the laser radiation or to high temperatures as a result of laser-substrate interactions will not crack and therefore not deposit. However, the depositing atoms (dissociation product of the parent gas) that are physisorbed on the substrate outside the area occupied by the nuclei will surface diffuse and ultimately will be captured by existing nuclei, form new nuclei or re-evaporate. When the physisorbed atom (adatom) diffusion length is determined by the length scale of the laser-irradiated zone, atom capture by the intentionally formed nuclei should be most probable and selective growth will occur. Achieving favorable growth conditions involves controlling the size of the laser-affected zone, the density of parent gas molecules, and the kinetic energy of the depositing species. This invention reveals the interplay between thermodynamics and kinetics during nucleation and growth via NSOM-LCVD; and establishes well-controlled, reproducible approaches for nanostructure fabrication.

As noted above, in many embodiments of the invention, the probes described above are used with a chemical vapor deposition (CVD) process, in particular LCVD (laser-assisted chemical vapor deposition). The CVD processes described herein include, but are not limited to, LCVD (laser-assisted chemical vapor deposition), laser-assisted VLS (vapor liquid solid) for the growth of nanowires and laser driven CVD processes for the growth of carbon nanotubes. When the probes are electrically conductive, either by probe base material or conductive coating, electrical bias can be applied for controlled CVD.

According to one embodiment, a probe and a sample substrate are positioned in a vacuum chamber configured for CVD. A precursor gas, such as silane $SiH_4$ flows into the process chamber and the probe is exposed to high intensity laser radiation either from inside or from outside the probe or from both inside and outside. In some arrangements, the laser radiation is pulsed laser radiation. The intense concentration of energy at the tip of the probe causes the precursor molecules to dissociate and the resulting fragments (smaller molecules and/or atoms) are deposited onto the substrate adjacent the tip of the probe to form a nucleus. As the laser radiation (e.g., pulses) continues, additional precursor molecules dissociate and the resulting fragments condense preferentially on the nucleus, thus depositing additional material onto the nucleus. The deposition can be stopped and restarted as desired by stopping and restarting the laser, or by adjusting the output intensity of the laser. The deposited material has high purity.

The precursor gas is often combined with a carrier and/or buffer gas, such as He, Ar or $H_2$ gas. The carrier gas can be used to flush the CVD chamber before the introduction of the processing gas mixture. In addition, the partial pressure of the processing gas mixture can be also adjusted for more precise control of CVD process by using remaining carrier gas as a buffer gas. The buffer gas maintains the reaction chamber at a desired total pressure condition, and displaces unwanted background gases such as oxygen in air ($SiH_4$ gas diluted in either He or Ar).

Carrier gases can also be used to help deliver some CVD precursor sources that are in the liquid phase (e.g. $Fe(CO)_5$ or $SiCl_4$) or solid phase (e.g., $Cr(CO)_6$). In order to deliver the precursor materials in gas (or vapor) form into the reaction chamber, carrier gases (e.g., a nonactive gas such as Ar for simple delivery, or an active gas such as hydrogen that is involved in part of the reaction ($SiCl_4$ and $H_2$ will generate by-product of HCl which tends to etch thermally grown oxide during the Si CVD process) can be flowed into the process chamber.

A few examples of precursor gases and the materials that are deposited using these gases are shown in Table 1. These gases are well known to one of ordinary skill in the art of CVD. However, any gas that can be used in CVD, LCVD, or MOCVD processes can be used in the methods disclosed herein.

TABLE 1

| Precursor Gas | Material Deposited |
|---|---|
| silane | Si |
| $Au(CH_3)_2$ | Au |
| $Ni(CO)_4$ | Ni |
| $Fe(CO)_5$ | Fe |
| $Mo(CO)_6$ | Mo |
| trimethylgallium + $NH_3$ | GaN |
| trimethylindium + $NH_3$ | InN |
| methylcyclopentadienyl platinum | Pt |

Figure 2A:
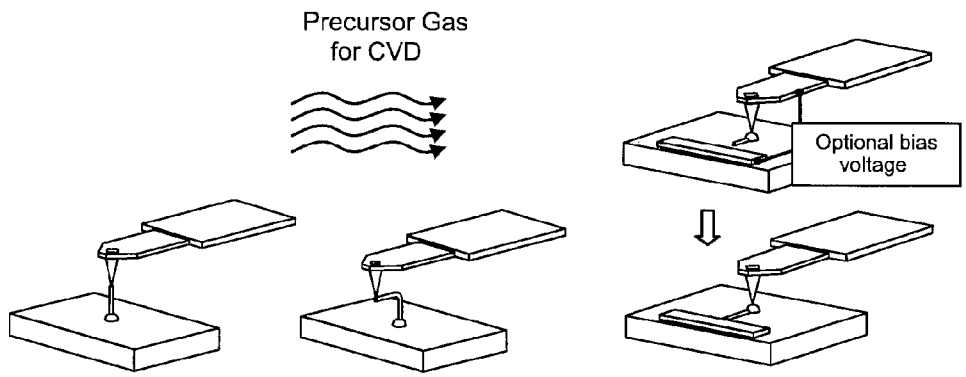
FIGS. 2a and 2b illustrate examples of various structures that can be made using materials processing methods in accordance with the present invention.
Figure 2B:
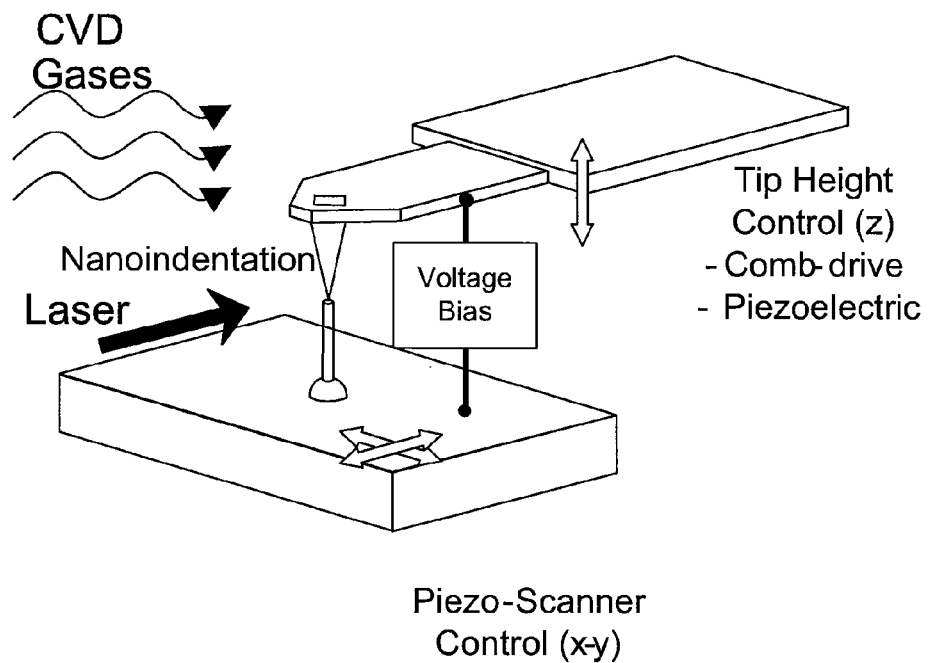

FIGS. 2a and 2b show examples of various structures that can be made using a deposition method in accordance with the invention. By moving the probe away from the nucleus perpendicular to the substrate, a linear structure perpendicular to the substrate is formed. In one arrangement, the substrate is moved away from the probe. It does not matter which component moves, as long as there is relative motion between the nucleus and the probe. If the probe changes direction and moves parallel to the substrate after the perpendicular linear structure is formed, a bend is introduced into the structure and a second segment parallel to the substrate is formed. When the probe is moved away from the nucleus parallel to the substrate, a linear structure along the surface of the substrate is formed. In one example, the movement of the probe can be controlled by piezoelectric drivers. The probe can be moved at any angle to the substrate as desired. Clearly, a wide variety of structures can be formed by moving the probe during the deposition. In some arrangements, a bias voltage can be applied between the probe and the substrate as described above. In some arrangements, the precursor gas can be changed during the deposition process to produce a structure with a varying composition.

In one arrangement, after deposition of a first material with a first precursor gas, the laser is turned off, and the chamber is flushed out to remove the first precursor gas. A second precursor gas begins to flow into the chamber and the laser pulses are turned on again. Thus a second material is deposited directly onto the first material.

In another arrangement, after deposition of a first material with a first precursor gas, a second precursor gas begins to flow into the chamber as the first precursor gas stops flowing into the chamber. The laser continues to pulse. Thus a second segment with a mixed (resulting from the mixture of first and second precursor gases) composition is deposited onto the first material. The composition of the second segment has an increasing contribution from the second precursor gas as the first precursor gas leaves the chamber until the segment composition is solely due to the second precursor gas. Thus a graded transition from the first material to the second material is achieved. The gradient between the materials can be controlled by the rate of change of the flow rates of the respective precursors. Multiple nozzles can be utilized to locally inject the different processing gases on the reaction spot. Based on this method, transit time between different growth stages and steps can be significantly reduced.

While aspects of the invention have been primarily described with reference to a nanoscale CVD application, the CVD configuration can be readily utilized for other laser material processing applications that may be simpler in terms of instrumentation. This essentially enables sharing some or the whole processing workbench. Furthermore, a minor and relatively straightforward modification of the apparatus can meet most of the processing requirements. For example, for laser-assisted etching, etchant gases such as $Cl_2$ may be flowed through the same gas nozzle system as was used for the deposition precursors. Selective heating of nanoscale domains by laser radiation through an NSOM probe yields a higher etching rate, according to the traditional Arrhenius type temperature dependence of the etching reaction rate. As etched depth increases, the position of the tip needs to be controlled in a reverse (i.e., approaching the sample) direction, compared to an additive (i.e., deposition) process. For local machining or phase transformation applications, the position of the tip is preferentially controlled in such a way that the tip apex is kept at a finite distance from the sample without contacting sample spots. Non-contact tip configuration can be realized through sensitive detection of tip-sample interaction force (e.g., shear force detection).

It should be noted that considering capabilities of subtractive, additive, and local modification, the described system enables a total solution workbench for general nanomanufacturing.

Figure 3:
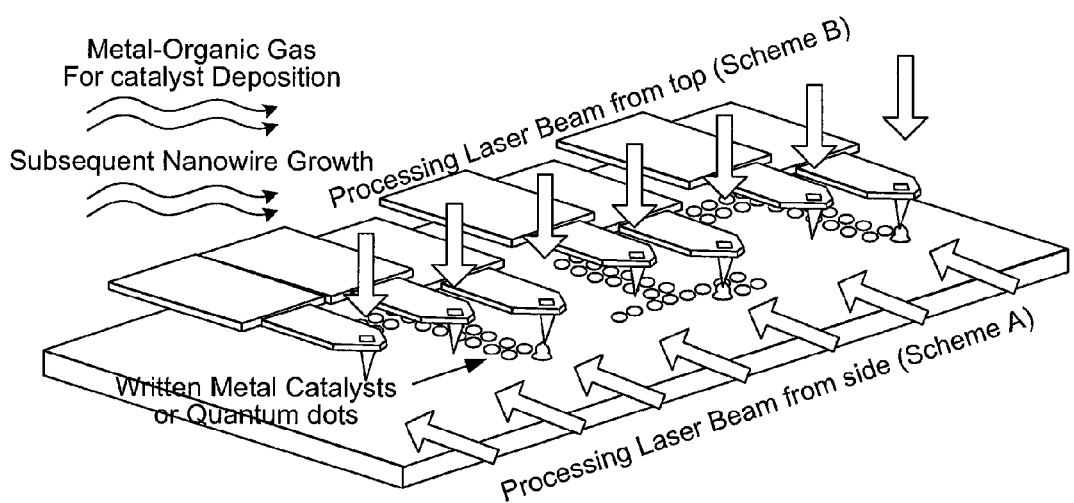
FIG. 3 is a schematic illustration of an embodiment of the invention incorporating an array of probes configured to perform high throughput nanoscale material deposition on a sample substrate.

FIG. 3 is a schematic illustration of an array embodiment of the invention. An array of probes is positioned to perform high throughput nanoscale material processing on a sample substrate. In this example, the processing operation is deposition. FIG. 3 shows laser radiation hitting the probes from outside the probes (Scheme A) and laser radiation traveling through the probes (Scheme B). Either or both of these schemes can be used. FIG. 3 shows deposition of growth catalyzing nuclei or dots. These dots can be made of metal catalysts that can be used as the starting nuclei for subsequent nanostructure (e.g., nanotube) growth by well-known bulk CVD methods.

Many alternative embodiments, using different processing operations, are also possible. For a laser-assisted etching process, etchant gases are introduced. For selective doping, dopant gases are utilized. For machining or inducing phase transformations, non-active gases might be introduced or ultra high vacuum conditions might be preferred, in order to avoid unwanted chemical reaction such as oxidation. In another arrangement, some or all of the array probes can be moved in a synchronized and concerted manner to grow structures from the nuclei as described above with reference to FIGS. 2a-b, or to fabricate all the above described nanopatterns. Such an array enables cost-effective manufacturing and mass production of the desired features due to the ease of manipulating optical beams (in contrast to electron beams).

As described above with particular reference to NSOM-LCVD implementations of the invention, and further below with regard to some specific applications, apparatus and examples, the present invention provides extremely versatile material processing techniques that enable the formation of technologically attractive microstructures of well-defined dimensions in a single-step process. These techniques can be used for a wide variety of applications including, but not limited to, the fabrication of contacts, circuit lines, interconnects, whole integrated circuits, and the repair of lithographic masks. In addition, techniques in accordance with the invention also offer unique capabilities for the directed formation, coating, and patterning of non-planar, three-dimensional objects.

Applications

The material processing techniques of the invention can be advantageously used in a variety of applications, some of which are described below.

Photomasks are used extensively in the fabrication of integrated circuits on semiconductor wafers. Standard photomasks include a patterned absorbing or opaque film on a transparent substrate. A metal, such as chromium, having a thickness on the order of about 100 nm is often used as the opaque film. Nickel and aluminum are also used. A transparent material, such as quartz, is often used as the substrate, though materials such as glass and sapphire can also be used. The photomask manufacturing process is not perfect, and defects, such as metal holes, are frequently encountered during photomask inspection. Masks having sufficiently large structures (e.g., greater than 250 nm line width) can be repaired using existing technologies, including focused ion beam (FIB) and laser ablation/re-deposition processes. Very small defects on these masks can often be tolerated. However, photomasks with small structures (e.g., less than 250 nm line width) cannot tolerate defects as small as 20 nm and there is no technology currently available that can make these repairs. Such masks must be discarded and replaced. Replacement of photomasks is a very costly manufacturing option that the semiconductor industry is trying to avoid. The methods described herein can be used to repair these small defects, thus providing the semiconductor industry with much-needed relief from the problem of small defects on photomasks.

In an exemplary embodiment of the invention, a photolytic process is used to repair photomasks. The probe used to either deposit missing patterns or to ablate and/or etch unwanted patterns for repairs can also be used as the probe for a near-field scanning optical microscope (NSOM), thus providing both inspection and repair of the mask in one instrument. This can be accomplished by coupling low power probe lasers or split components of the processing beam through the same probes and monitoring the transmitted, reflected or scattered radiation. In another arrangement, any of the probes described herein can be installed in a scanning electron microscope (SEM) outfitted with nanoprocessing capability. The SEM can be used to inspect the photomask and locate defects, and the process described herein can be used to repair the defects as they are found.

In another exemplary embodiment, the processes described herein can be used to fabricate nanoscale devices that contain organic components or that are fabricated on flexible organic substrates. Processes typically used for inorganic semiconductor fabrication involve temperatures that are too high for organic electronic circuit manufacturing. Organic materials are delicate and are damaged at high temperatures. The processes described herein can be used at temperatures appropriate for organic electronic circuits or for flexible substrates. Nanoscale etching and deposition of organic materials can be done using the probes and processes described herein using the same instrument and at room temperature. Furthermore, deposition and growth of nanostructures via the herein described processes can be effected without inflicting thermal damage on the substrate or neighboring structures. Such processing would result in significant manufacturing cost reduction for the organic semiconductor manufacturing industry. This is a viable technology for fabricating nanoscale organic devices that require both nanoscale etching of organic layers and nanoscale deposition of metal and semiconductor circuits or electrodes.

Figure 4A:
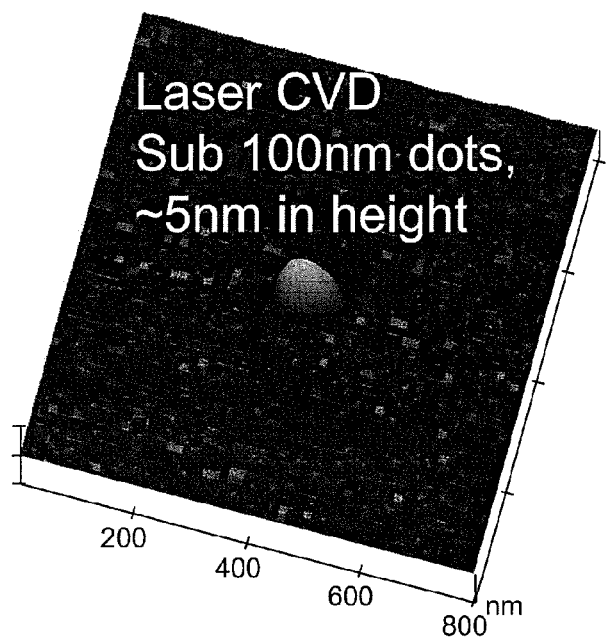
FIG. 4a shows an atomic force microscopy (AFM) image of a Si nanodot less than 100 nm in width and about 5 nm in height made using methods and apparatus in accordance with the present invention.
Figure 4B:
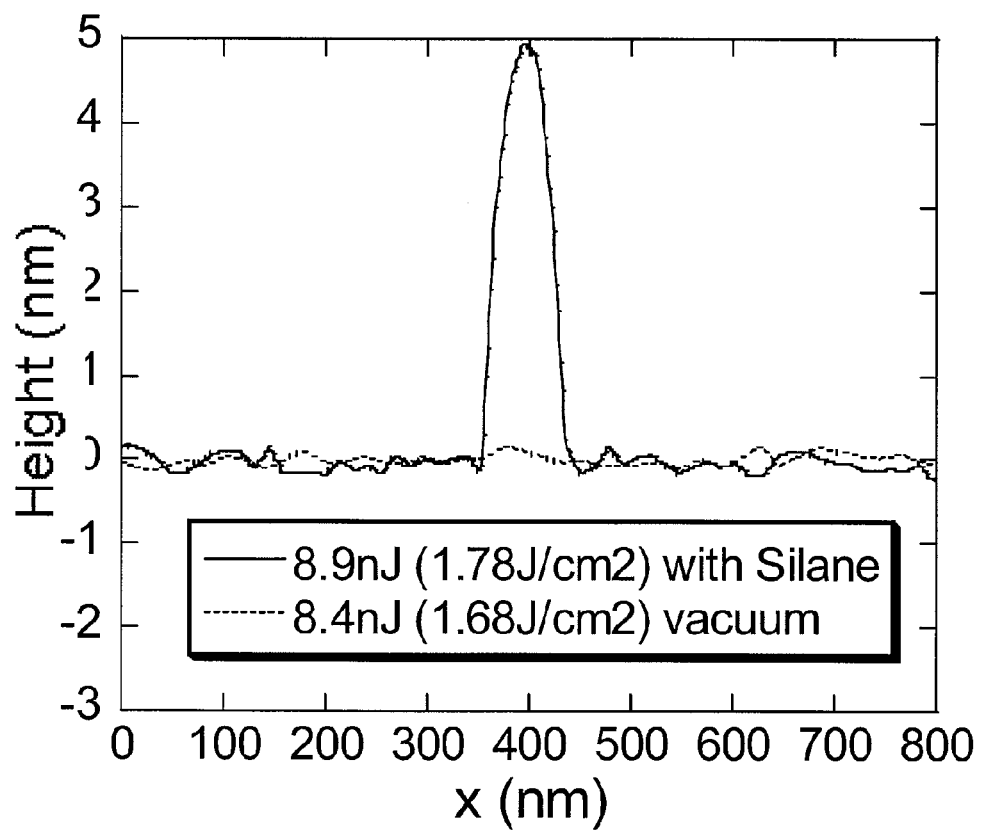

FIG. 4a shows an atomic force microscopy (AFM) image of a Si nanodot less than 100 nm in width and about 5 nm in height, which was made using the methods and apparatus described herein. FIG. 4b is a plot of the AFM probe height as a function of position on the sample. The dotted line is the scan of the sample surface before the NSOM deposition. The solid line is the scan of the sample surface after the NSOM deposition. It is clear that the deposition process does not cause deformation or damage to the underlying substrate.

Superposition of laser beams of different pulse lengths and wavelengths can be utilized to improve the effectiveness and speed of the nucleation/deposition/crystal growth sequence. Several parent gas/substrate combinations used in NSOM-LCVD method for selective deposition of nanodots include: Au nanodots deposited by cracking the $Au(CH_3)_2$ parent gas; Ni, Fe and Mo deposited by pyrolysis/photolysis of $Ni(CO)_4$, $Fe(CO)_5$, $Mo(CO)_6$, respectively.

In another example, laser-assisted nanodeposition can be used to produce electrically coupled arrays of small-diameter nanotubes and nanowires configured into circuits. Nanoscale channels can be formed on a silica substrate, for example, by capping nanomachined trenches fabricated by FIB machining. Nanotube or nanowire growth is initiated at predetermined locations within the channels by decorating the trenches with catalyst nanodots deposited by NSOM-LCVD, such as described herein. The channels serve as planar scaffolds supporting nanotube and nanowire growth in a manner analogous to the use of anodized alumina porous membranes for the formation of vertical arrays. This scheme enables the growth of nanotubes or nanowires into arbitrary 3-D patterns.

The highly selective nature of the NSOM-LCVD process in accordance with the invention enables the integration of widely varying nanostructures on a single substrate, in conjunction with other processing capabilities. This is very attractive for the realization of integrated systems in which the functionality of each nano sized building block must be engineered individually. A wide variety of different structures made of a variety of different materials can be fabricated and connected. The creation of highly localized deposition zones as is possible with NSOM-LCVD is crucial for structures that use a variety of compounds that have to be stable over widely different temperature ranges.

In Situ Process Monitoring and Apparatus

Even though optical imaging techniques offer convenient in situ monitoring, their spatial resolution is frequently not sufficient for inspecting detailed phenomena occurring in micro/nano structures upon light illumination, hence requiring subsequent ex situ characterization tools such as atomic force microscopy (AFM), scanning electron microscopy (SEM), and transmission electron microscopy (TEM). Besides the inconvenience, inspection of transient light-matter interaction is limited. When it comes to the permanent modification of the micro/nano structures, an ex situ characterization tool might be still useful. However, critical processing parameters cannot be readily determined, leading to difficulties in optimizing the processing parameters as well as introducing multiple sample transferring tasks between the processing system and the ex situ characterization setup. Maintaining consistent processing conditions while the sample is being relocated multiple times is very difficult due to the nanoscale feature dimensions. Workstations in accordance with some embodiments of the present invention therefore combine nanoscale materials processing with in situ imaging and characterization on dedicated scanning electron microscope (SEM) and transmission electron microscope (TEM) instruments. With this novel integrated approach, it is possible to conduct fundamental investigations (including, but not limited to, in situ monitoring) of nanoscale processing with unprecedented resolution and accuracy. These workbenches are valuable not only for in situ micro/nanoscale material processing monitoring but also for in situ characterization of a wider range of light-matter interactions.

Figure 5A:
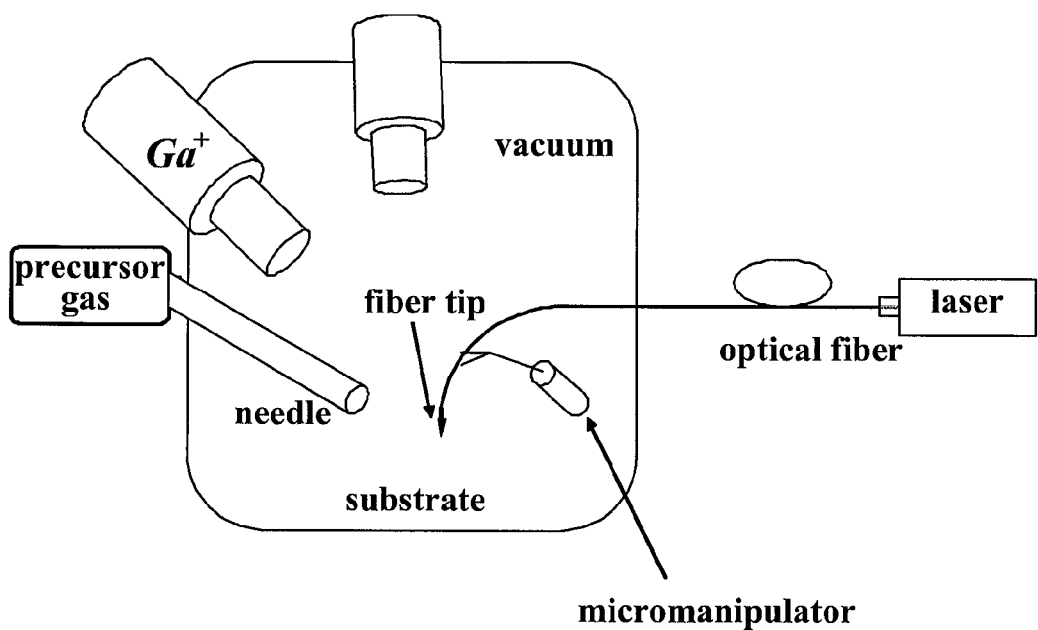
FIG. 5a depicts a schematic diagram of an integrated SEM/FIB apparatus in accordance with one embodiment of the present invention.

Integration of nanoprocessing tools such as e-beam and focused ion beam (FIB) into imaging tools such as SEM and TEM, then, allows integration of photon and electron beam systems. This enables fast in situ imaging of the target specimen and the nanoscale materials deposition, and also allows use of e-beam and FIB processing capabilities. A benefit of this approach is easily conceived in the modification and repair of existing devices and circuits, as discussed above. Another significant capability is the easy application of analytical diagnostics (e.g., x-ray spectroscopy). A schematic diagram that shows modification of a FIB system with custom micromanipulators, a laser probe for nanodeposition, a precursor gas source, and a scanning electron microscope is shown in FIG. 5a. Coupling of a laser to a dual-beam SEM and FIB system has been successfully demonstrated by use of an optical fiber based probe as a versatile in situ laser processing system. Pulsed laser illumination delivered onto the sample under SEM imaging without disturbing the original function of the dual-beam system provided excellent in situ monitoring capability for a variety of laser material processing examples such as ablation, cleaning, local modification of nanowire structures, and laser-assisted chemical vapor deposition. In addition, in situ characterization of the laser-induced features by EDS and in situ repair capability of the damaged probe by FIB milling function was demonstrated, further highlighting great usefulness of the setup. These results are described further in the examples below. The combination of guided laser radiation with SEM, and FIB instruments thus offers a truly formidable capability for in situ imaging as well as multi-level processing and great promise on in situ optical detection and in situ nanoscale processing.

Figure 5B:
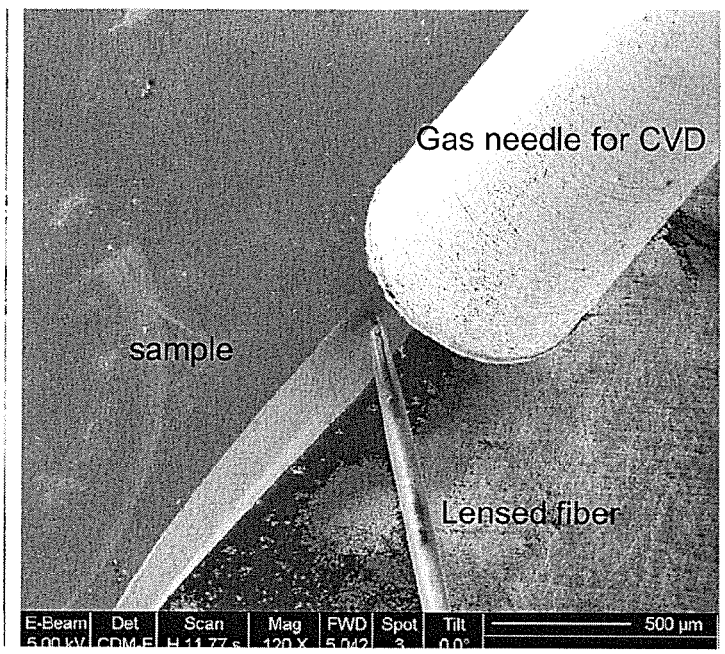
FIG. 5b is a SEM image of the components of an integrated SEM/FIB system, as shown in FIG. 5a, in operation.
Figure 5C:

FIG. 5b is a SEM image of the components of a system, as shown in FIG. 5a, in operation. FIG. 5c is a Pt EDX (energy dispersive x-ray spectroscopy) map that shows Pt nanostructures that have been deposited using this system. In situ LCVD of Pt was performed within the dual beam system, utilizing a lensed tapered fiber. The precursor gas (methylcyclopentadienyl trimethyl platinum) density desired at the sample surface was set via regulation of the gas flow and by the proximity of the needle orifice with respect to the sample surface. The needle system for FIB deposition was shared to deliver the precursor gas by achieving spatial overlap of the laser focus at eucentric height. For selective Pt LCVD, nanosecond laser pulses of 532 nm wavelength containing a small fraction of 266 nm wavelength radiation are focused onto the side wall of a silicon sample via the lensed fiber. The in situ Pt LCVD was carried out at a laser fluence approximately 80-90% of the bulk silicon substrate melting threshold.

Figure 6:
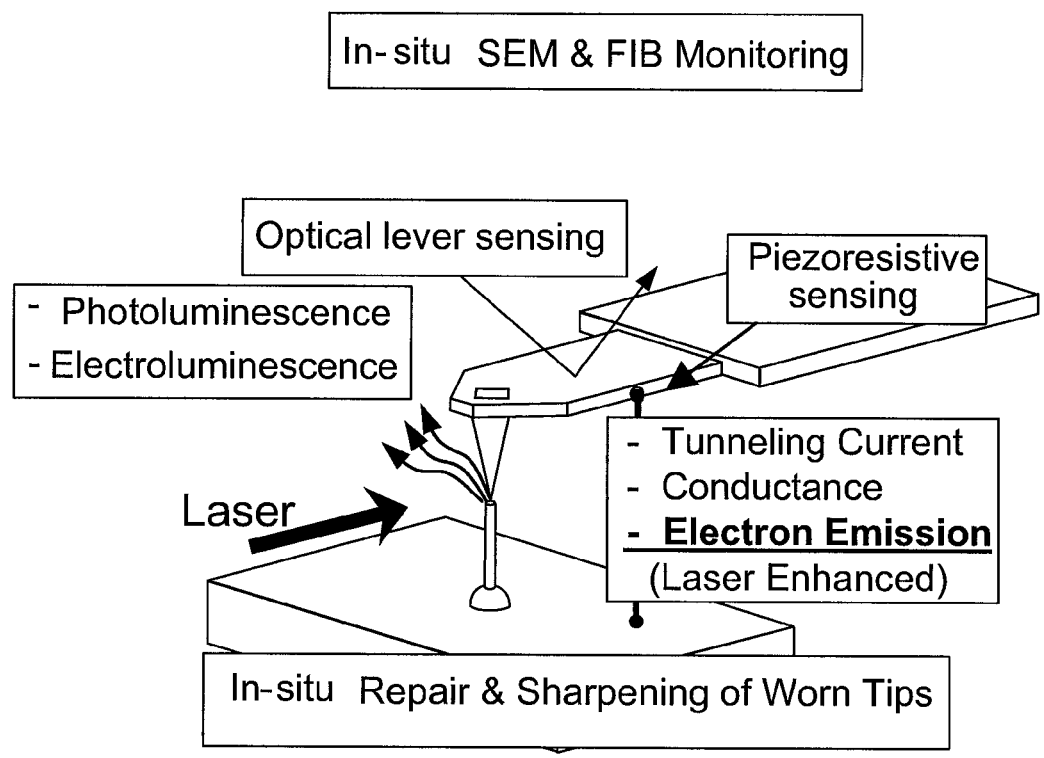
FIG. 6 depicts a schematic diagram of an instrument for nanostructure material processing in accordance with one embodiment of the present invention.

In one embodiment of the invention conceptually illustrated in FIG. 6, an NSOM probe is instrumented with in situ height sensing capability that can be optical or based on photoelectron emission. Optical lever sensing is achieved by irradiation of a separate laser beam onto the top of the cantilever, and detection of the reflected laser beam by a four segment position detector in order to optically measure the deflection of the cantilever. Through feedback of the measured cantilever deflection information, precise control of tip-sample gap distance is controlled by a piezoactuator implemented either in the sample stage or in the cantilever.

Alternatively, a non-optical method of measuring the cantilever deflection can be implemented through piezoresistive layers in the cantilever.

However, frequently, the deflection of the cantilever either by optical lever or piezoresistive sensing cannot provide sufficiently precise tip-sample gap information due to complex interaction mechanisms between atoms on the tip and sample.

In this regard, electrical bias between tip and sample can provide a more accurate measurement of tip-sample gap distance. According to one specific embodiment, the electrical measurement is made by measuring electrical current through the gap by use of an external current amplifier. Depending on the specific range of the gap distance, three different regimes are available; (1) when the gap is zero or near zero (contact), electrical conductance measurement, (2) when the gap is in the about nm or sub nm range, tunneling current measurement, and (3) when the gap is larger than about nm (up to about μm) electron emission measurement (positive bias on the tip). In particular, laser illumination in an NSOM configuration further improves the sensitivity and reliability of the current signal (as experimentally demonstrated by Stratakis et. al. (Stratakis, E., Hwang, D. J., Misra, N., Spanakis, E., Grigoropoulos, C. P., Fotakis, C., and Tzanetakis, P., "Photoelectron emission probing of Si nanowires," *Nano Letters*, Vol. 8, pp. 1949-1953 (2008)). Therefore, for any desired tip-sample gap chosen, depending on the range of the optical near-field and specific growth rate of the nanostructures, the current measurement can provide precise in situ gap distance information.

A photoluminescence signal induced by NSOM laser illumination or an electroluminescence signal induced by electrical bias can be collected either by the same NSOM probes or by an external collecting lens optics array. The collected light signal can be delivered to the optical spectroscopy system, providing either tip-sample gap distance information or an in situ process monitoring signal. In terms of gap distance measurement, these signals show strong dependence within a few nm's range. This allows for accurate placement of the tip over the target surface and dynamic control of the intensity distribution imparted on the target and the ensuing thermo-physico-chemical processes. Utilizing these capabilities, it is possible to define growth catalyzing dots on the substrate and subsequently direct nanowire growth, for example. This sensing capability is also useful to detect the fabricated features in situ for efficient monitoring of processing underway. Ultrafast laser radiation is beneficial for defining the growth catalyzing dots on the substrate, ensuring minimal thermal diffusion and thus controlling the nanofeature size, and for minimizing the size of the features by reducing the thermo-physico-chemical diffusion length scale. Nanosecond pulses, or continuous wave and modulated laser pulses can be utilized for the nanowire growth. In addition to the coupling of the laser beam normal to the tip, the beam can also be guided through a fiber or an aperture.

The SEM/FIB function of the apparatus permits in situ tip conditioning, repair and monitoring of the processing operation. By locating the whole nanoprocessing setup inside SEM/FIB machine, processing details can be monitored in situ utilizing various original functions of the SEM/FIB system. The condition of the processing tip can also be under in situ monitoring, and in situ repair can be also performed when damage or contamination of the tip occurs utilizing various methods, such as FIB milling/deposition and NSOM or secondary laser based ablation/cleaning/deposition/etching.

In one embodiment of the invention, an instrument for laser-deposited nanostructures includes a laser, near-field scanning optics, and apparatus for flowing CVD precursor gas into a sample chamber. Currently, there are commercially available near field optics that have a spot size of about 100 nm. 10 nm feature resolution has recently been demonstrated with femtosecond laser driven neat field enhancement via coupling to AFM tips (Grigoropoulos, C. P., Hwang, D. J., and Chimmalgi, A., "Nanometer-scale direct-writing using near-field optics," *MRS Bulletin*, Vol. 32, 16 (2007)). With such a system it is possible to produce nanostructures with feature sizes less than 10 nm. Such an instrument can also be integrated into existing manufacturing equipment at low cost, offering both performance and cost advantages over other known nanoscale fabrication process.

In the preliminary in situ SEM studies described in the examples herein, the NSOM probe was held by a micromanipulator allowing one linear motion, and two tilting motions. Another configuration is based on parallelism by use of three-dimensional linear piezo positioner composed of three orthogonal linear motions. This configuration can facilitate positioning an NSOM probe tip with respect to the sample without tilting motions so that optical near-field coupling conditions on the sample are kept consistent while the relative XY position of the sample spot is adjusted.

Another feature of some apparatus embodiments of the present invention is that the tip and sample holding structures (tip positioner and sample positioner) are fixed on a single block, which should be located at the SEM sample holder. In this way, no change in relative position of the NSOM probe tip occurs with respect to the sample position while the sample is tilted in order to inspect the sample by SEM under a different tilt angle. Normal top view inspection is preferred when precise imaging of the sample surface is required, while 90 degree angle side-view inspection (viewing direction normal to the sample surface) is convenient in order to see the NSOM probe tip-sample gap under SEM imaging. The tilt angle may be compromised at an intermediate angle, to roughly monitor both aspects. Since alignment of the probe tip and inspection of the processed sample spot are frequently switched, having both tip and sample holding structures on a single structure is advantageous.

Even though the aforementioned in situ SEM provides an efficient method of monitoring and controlling the tip-sample gap, implementation of an independent tip-sample gap distance control system can offer more versatile capability of the nanoprocessing workbench. The independent tip-sample gap control system can be based on virtually any scanning probe microscope (SPM) mechanism. In specific embodiments for nanostructure growth applications, non-contact mode is preferred and all the components/parts are compatible with ultra high vacuum to combine with a SEM. One example is based on lateral interatomic shear-force detection as a feedback for the distance between probe tip and the specimen surface.

Figure 7:
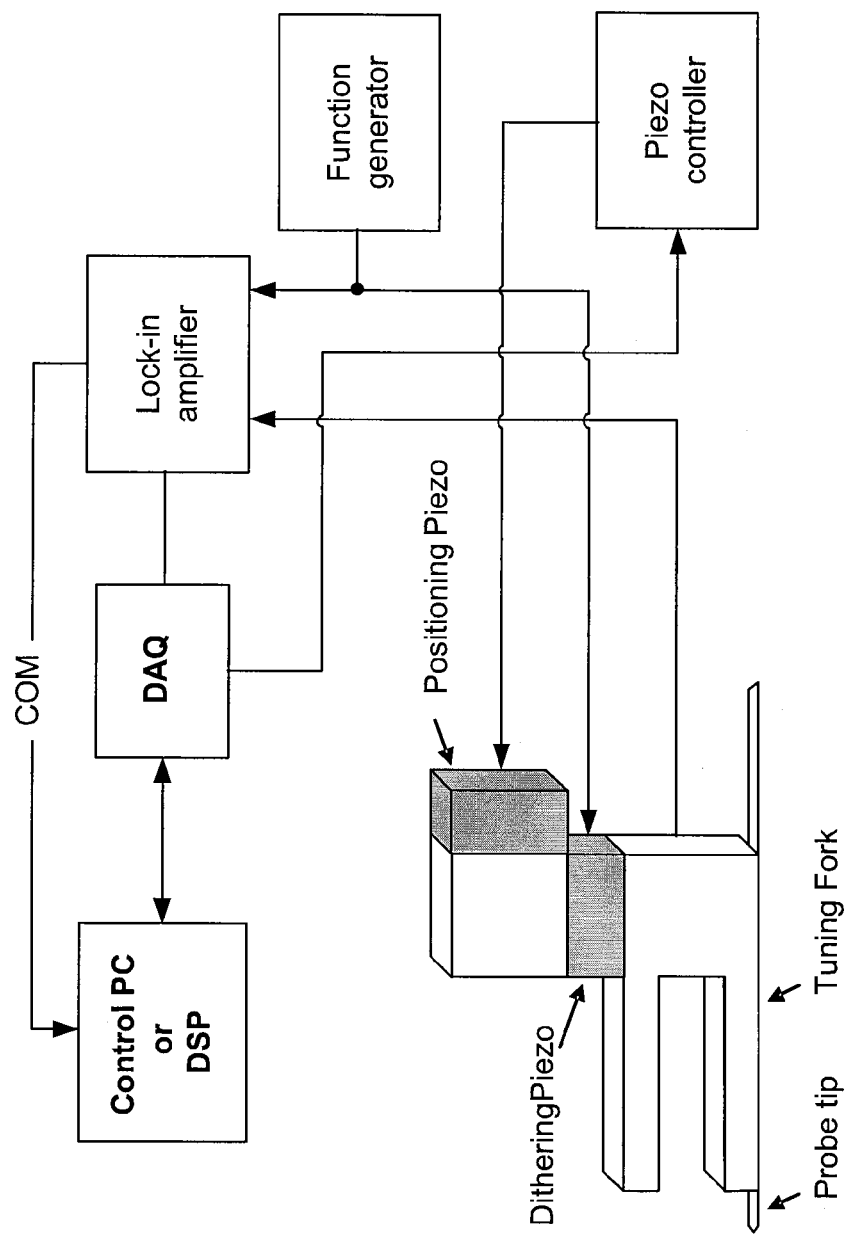
FIG. 7 depicts an independent tip-sample gap distance control system component in accordance with one embodiment of the present invention.

As depicted in FIG. 7, a piezo-electric tuning fork crystal holds the probe tip and acts as the transducer excited by the lateral sine signal of a multilayer piezo actuator (dithering piezo). The frequency of the dithering piezo is set at around the resonance frequency of the tuning fork. However, depending on the specific method of attaching the probe tip onto the one leg of the tuning fork, a natural frequency of the combined system can show a slight deviation from the original natural frequency of the tuning fork at free-standing state (when probe tip is far enough from the sample surface). Upon approach of the probe tip towards the sample surface, both amplitude and phase of the laterally vibrating probe tip experience change as function of the tip-sample gap. Typically, the amplitude decreases from a gap range of about 100 nm to one of about 10 nm due to increased interaction between atoms on the tip and sample, offering efficient information on the tip-sample gap. Since the tuning fork-based gap signal is generally extremely weak with respect to the noise level, the signal can be amplified by use of lock-in amplifier synchronized at a frequency based on the dithering piezo driver.

Feedback control of a third piezo element (tip positioning piezo) based on the measured gap distance signal (output of lock-in amplifier) can offer an independent gap distance control system. Either a personal computer (PC) with a data acquisition (DAQ) system or a compact and separate DSP (digital signal processing) system with DAQ can be utilized for the feedback gap distance control system.

The elements, i.e., connecting/fixing blocks, piezo elements, and mechanical/electric interconnection elements, are combined in a compact and high-vacuum compatible way. The stand-alone gap control system is not limited to SEM/TEM; it can be combined within an arbitrary gas environment for various modification/processing/illumination applications.

The integration of laser NSOM configurations with SEM and FIB machines offers a powerful nanoprocessing platform. Moreover, in order to understand the microstructural evolution of a sample under laser processing, it is also possible, in accordance with other embodiments of the invention, to run in situ laser processing operations inside a Transmission Electron Microscope (TEM) where the evolving micro/nano structures can be monitored in real time. The implementation of the integrated TEM apparatus is analogous to that described and demonstrated for the SEM-based apparatus. Laser coupling with a TEM instrument can achieve nm imaging resolution.

Figure 8:
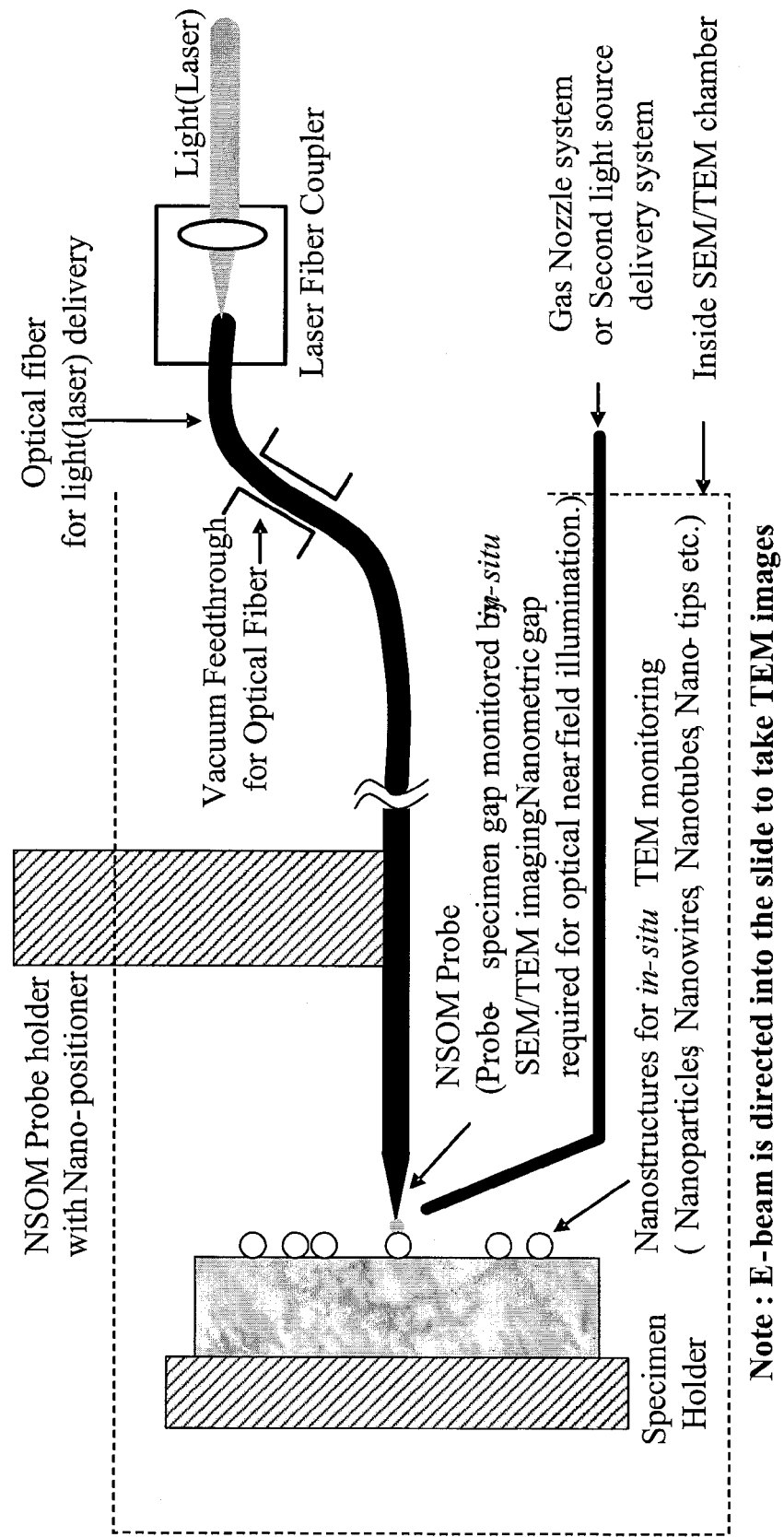
FIG. 8 depicts an overall conceptual schematic of an in-situ SEM or TEM monitoring of a laser-nanostructure interaction process in accordance with one embodiment of the present invention.

A conceptual schematic of a SEM or TEM apparatus configuration is illustrated in FIG. 8. This schematic describes the experimental setup for in situ laser probing in an SEM or TEM. First, laser light is coupled into an optical fiber through a laser fiber coupler. This fiber optic is passed through a vacuum feed-through into the microscope chamber. The NSOM probe, at the end of the fiber, is then positioned with a positioning device capable of nanoscale motion as well as larger-scale motion in the range of millimeters. The former can be accomplished with piezomanipulators while the latter can be accomplished through screw-type manual positioners. Electronic feed-throughs for the piezo-driven positioners can be introduced into the vacuum separately. The optical fiber is then attached to the positioners, for example by Cu vacuum tape or glue. In the experiment, the probe is brought into near-contact with a sample in a direction normal to a sample surface and perpendicular to the electron beam.

Delivery of light and/or laser into the SEM/TEM vacuum chamber is often limited by geometric constraints and complex subsystems of various SEM/TEM configurations. However, light (laser) can be introduced into the SEM/TEM vacuum chamber utilizing flexible and thin optical fibers. A compression fitting type vacuum feed-through can be utilized to pass the fiber through the SEM/TEM chamber, delivering arbitrary light (laser) sources while maintaining high vacuum level.

In such an embodiment, one end of the fiber is located outside the SEM/TEM vacuum chamber, cleaved for laser coupling. Laser (light) is coupled to the cleaved end and is delivered by total internal reflection (TIR) through the fiber to the other end of the fiber.

An optical near-field probe (NSOM probe) can be implemented at the other end of a fiber located in the SEM/TEM vacuum chamber, by a fiber pulling or chemical etching process. Other NSOM probe designs, such as AFM type microfabricated hollow top light coupling probes, may be used as well. In the latter case, light (laser delivery) can be conveniently introduced into the SEM/TEM vacuum chamber by the optical fiber, and the end of the fiber inside the SEM/TEM chamber can be coupled to arbitrary types of probe design, for example by gluing or by using extra fixture structures. The end of the fiber inside the vacuum chamber can be modified as an intentional lens shape to improve the coupling efficiency between the fiber end and the light entrance of the arbitrary NSOM probes.

The other end of the fiber is fixed at the micro/nano positioner in order to precisely locate the probe end onto the specific position of the sample specimen at a desired probe tip-sample distance. Typically, piezo-positioner or piezo-scanner allows nanometric position accuracy. For more efficient positioning of the tip, the sample can be also located on piezo-positioner or piezo-scanner.

A secondary optical fiber system can offer external illumination onto the NSOM probe in order to realize external laser based apertureless NSOM configuration or additional optical excitation onto the main NSOM illumination spot. The secondary fiber system can be also used for the collection of various optical signals from the main NSOM spots, delivering the collected optical signal to external diagnostic systems, such as a spectrometer.

The secondary optical fiber path can also be used for a gas delivery system, which allows various chemical processes such as CVD and etching. Similarly, the gas delivery system may collect the materials generated as a result of the main NSOM illumination.

In the embodiment depicted in FIG. 8, e-beam is mainly directed into the chamber for SEM or TEM imaging in order to monitor the tip-sample gap. However, in case of a SEM, the whole assembly can be tilted in order to inspect more details of the sample surface.

A wide variety of light and/or laser sources can be coupled to the optical near-field probes for in situ laser processing and/or characterization of light-matter interactions. TEM in particular has complex internal structures to realize the potential of fiber based NSOM laser and/or light.

The recent development of a quantitative in situ nanoindentation holder for a TEM demonstrated for the first time the ability to measure the mechanical properties of individual nanostructures and nanoscale volumes of bulk materials and thin films inside a TEM (Minor, A. M., Asif, S. A. S., Shan, Z. W., Stach, E. A., Cyrankowski, E., Wyrobek, T. J., and Warren, O. L., "A new view of the onset of plasticity during the nanoindendation of aluminum" *Nature Materials*, Vol. 5, 697-702 (2006)). By positioning a diamond indenter using a piezoceramic manipulator, this apparatus can probe the mechanical properties of nanocale volumes of materials. In accordance with the present invention, a similar TEM holder can be adapted by attaching a fiber optic cable to the end of the manipulator to be able to view the local micro/nano structure of materials undergoing light-matter interaction in real time. The fiber optic cable can be attached to the end of the TEM manipulator in the same position as the indenter tip shown here. This in situ TEM holder enables direct observation of the micro/nano structural characteristics associated with light-matter interactions.

Figure 9:
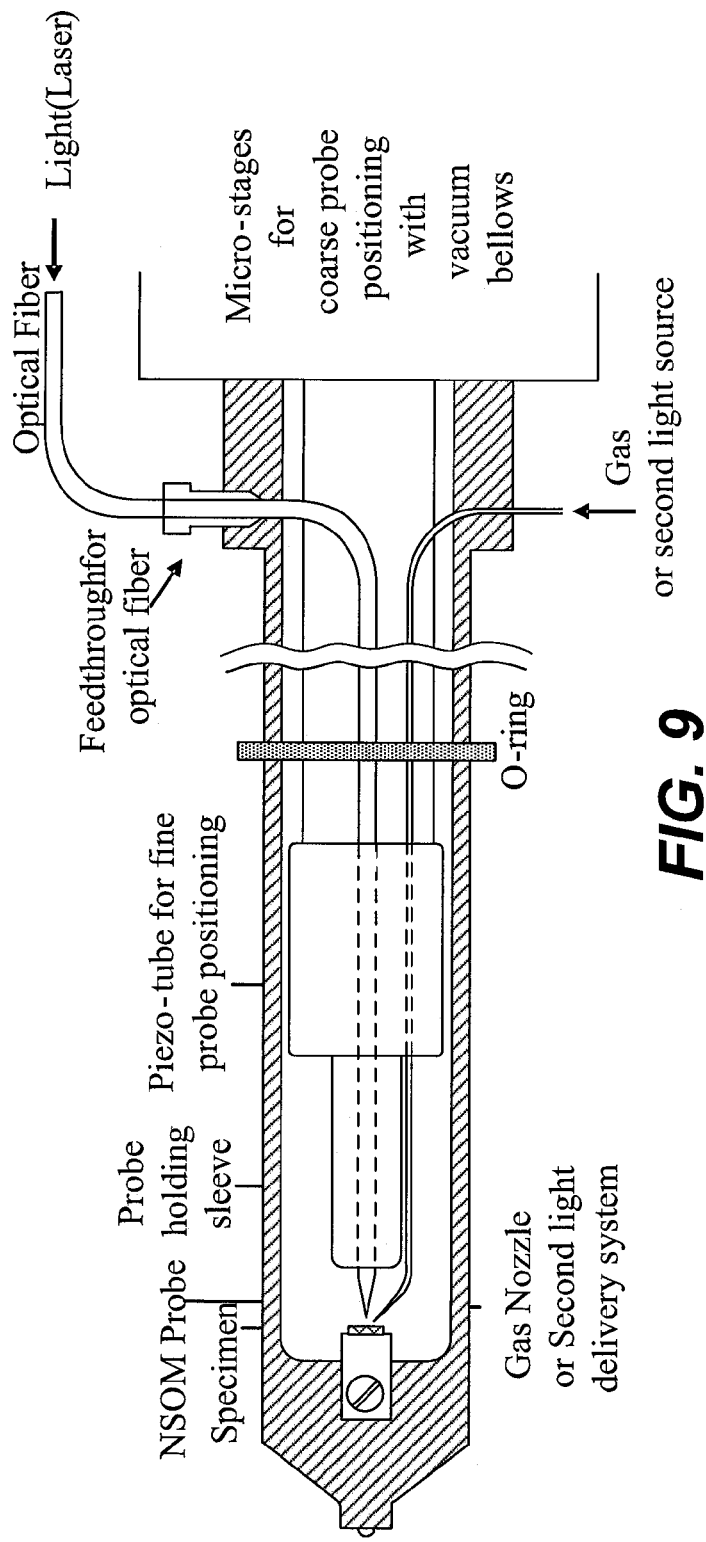
FIG. 9 depicts a sample design of a schematic view of a sample design of a TEM NSOM apparatus component in accordance with one embodiment of the present invention.

FIG. 9 provides a schematic view of a sample design of a TEM apparatus in accordance with the present invention. In an analogous manner to the schematic shown in FIG. 8, laser light is coupled into an optical fiber through a laser fiber coupler and then passed through the holder wall by a vacuum feed-through. At this point, the optical fiber is routed down the shaft of the TEM holder so that it does not exceed its maximum bending radius and also does not interfere with the manipulation devices. The TEM holder in general has two positioning systems, a coarse-type for macroscopic (millimeters) and piezo-driven actuation for fine scale (nanometers). The fiber tip is attached to the end of the main rod so that it is positioned by both systems. In this case, there is a piezo tube for three dimensional positioning and a piezo stack for movement in the rod direction (towards the sample). Electrical signals are run on separate wires down the length of the shaft and attached directly to the piezo elements. The optical fiber is laid along the rod and held in place by a tube near the end of the shaft. The fiber passes through this tube, which both holds the fiber in place and directs the tip of the fiber towards the sample. The probe is then brought into near-contact with the sample in a direction normal to a sample surface and perpendicular to the electron beam (in the figure, the electron beam would be directed into the page). The holder can be augmented with a gas nozzle delivery system or second optical fiber attached to the same main rod in a similar manner as described for the primary optical fiber.

The gas nozzle system can be installed as shown in FIG. 9 when a specific gas based process (e.g. CVD, chemical etching, doping)/interaction is of interest. In a similar manner to the gas nozzle system, the second light source can be delivered in various configurations. The end structure of the second light source delivery system nearby the TEM field of view, can be, but is not limited to, a lens shape to either illuminate light (laser) or to collect the emitted light signal in an aperture-less NSOM scheme.

It is highlighted that another aspect of this invention is a tool for characterization of light interaction with nanomaterials by combining tip-based nanoscale light (laser) radiation sources with a transmission electron microscope (TEM). Nanoscale confinement of radiation fields of enhanced intensity underneath the tip enables a highly localized light interaction with a wide range of nanomaterials, such as local electronic/molecular excitation and local modification of nanoscale specimen configuration, which provide new opportunities for the characterization and processing of nanostructures.

By selecting appropriate laser wavelengths ranging from the UV to the IR and the pulse durations from continuous wave to ultrafast (i.e., femtosecond pulses), the target specimen characteristics can be matched enabling highly selective materials excitation and/or modification processes. Further optimal coupling of the laser radiation with the focusing tip can be achieved by tailoring the temporal and spectral profile of the laser pulse, and controlling the pulse train temporal spacing and number of pulses. Light composed of tailored spectral components can be also coupled, which is extremely useful in exploring nanoscale light interaction mechanisms as in the solar cell application field. Various apertureless and apertured probe designs can be applied to induce desired light interactions at the desired size of the radiation source.

EXAMPLES

The following examples provide details illustrating aspects of the present invention. These examples are provided to exemplify and more clearly illustrate aspects of the present invention and in no way intended to be limiting.

Example 1

In Situ Monitoring of Ablation Crater Fabrication

Figure 10:
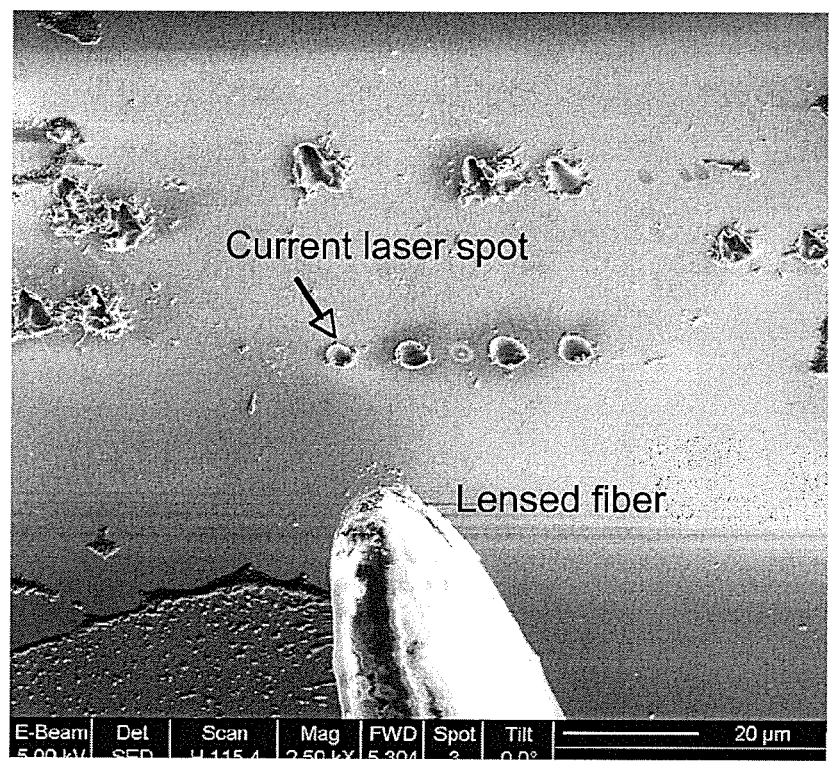
FIG. 10 shows in situ monitoring of fiber probe based ablation craters in accordance with one embodiment of the present invention.

FIG. 10 shows in situ monitoring of fiber probe based ablation craters. Single nanosecond laser pulses of about 4-6 ns temporal pulse width and 532 nm wavelength were applied onto a silicon sample to fabricate each crater.

Example 2

In Situ Cleaning of Agglomerated Nanoparticles

Figure 11:
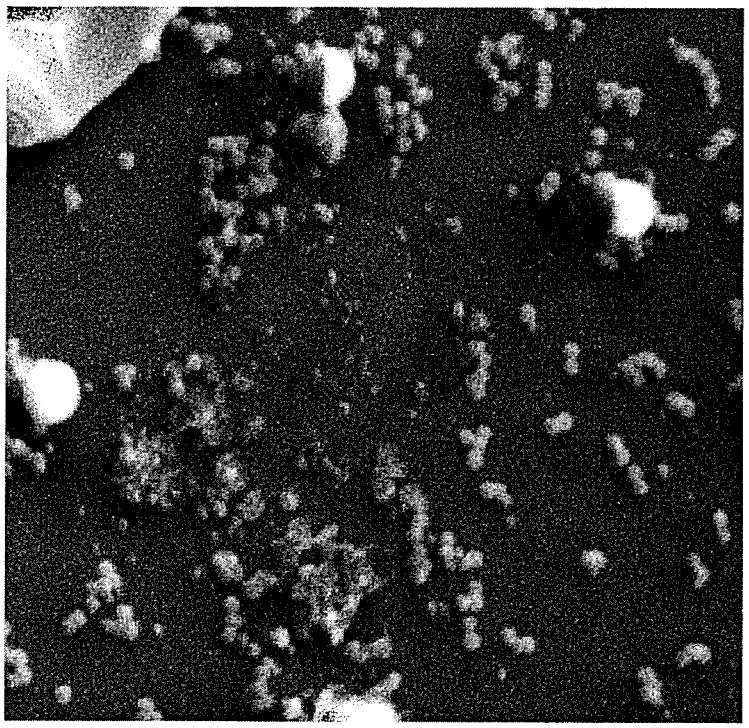
FIG. 11 shows the in situ cleaning of agglomerated nanoparticles (mixed polystyrene spheres of about 90 nm and about 300 nm diameters) by fiber probe illumination in accordance with one embodiment of the present invention.
Figure 11:
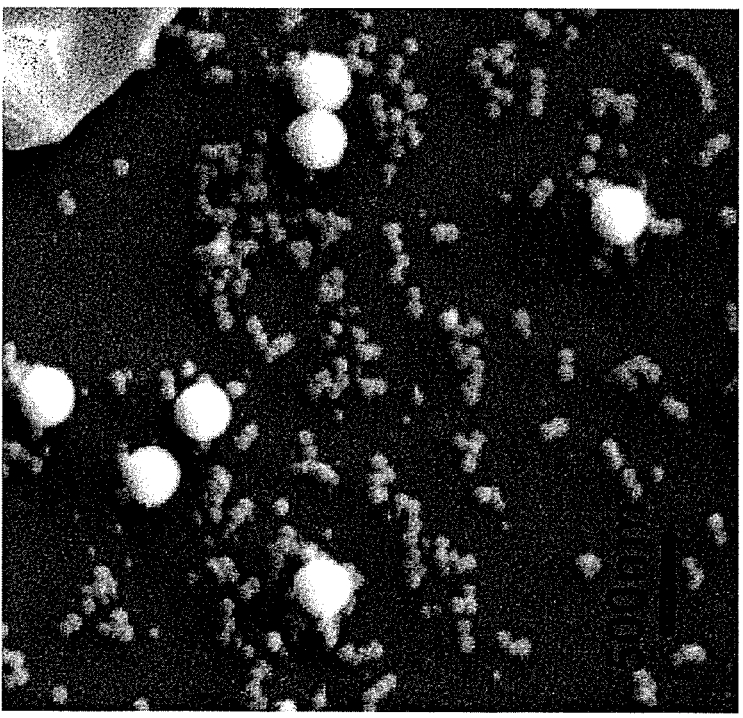

FIG. 11 shows the in situ cleaning of agglomerated nanoparticles (mixed polystyrene spheres of about 90 nm and about 300 nm diameters seen in panel (a)) by fiber probe illumination. A single nanosecond laser pulse of about 4-6 ns temporal pulse width, about 214 nJ pulse energy, and 532 nm wavelength was applied to remove particles from a silicon substrate (panel (b)).

Example 3

Local Modification of Single Silicon Nanowires

Figure 12:
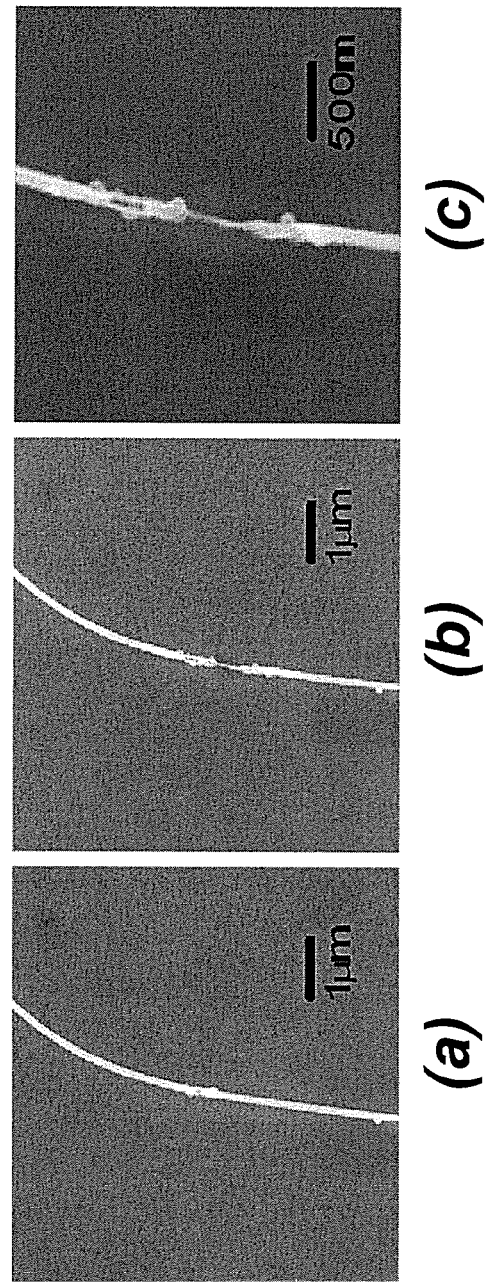
FIG. 12 records the fiber probe based local modification of single silicon nanowires in accordance with one embodiment of the present invention.

FIG. 12 records the fiber probe based local modification of single silicon nanowires. Nanosecond laser pulses of about 4-6 ns temporal pulse width, 532 nm wavelength, and repetition rate of 10 Hz were applied to induce local modification. Laser pulse energy roughly one third of in situ measured bulk silicon substrate damage threshold value was used. FIGS. 12a and 12b show the nanowire damage after about 100 laser shots (12a), and after an additional about 100 laser shots (12b). FIG. 12c depicts an in situ magnified image of FIG. 12b.

Example 4

Fiber Probe Based Photophysical LCVD of Pt Dots

Figure 13:
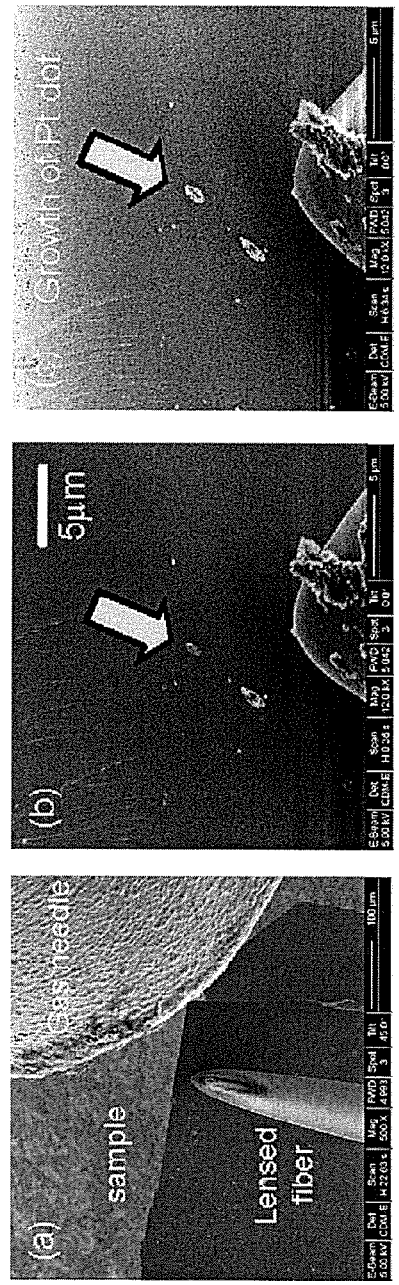
FIG. 13 shows the fiber probe based photophysical LCVD of Pt dots in accordance with one embodiment of the present invention.

FIG. 13 shows the fiber probe based photophysical LCVD of Pt dots. Nanosecond laser pulses of about 4-6 ns temporal pulse width, and mixed 532 and 266 nm wavelengths were applied. An in situ SEM image of the experimental apparatus is depicted in FIG. 13a. Deposited dots on a thin Au film (about 5 nm) on a silicon sample with native oxide, after about 50 laser shots at about 80-90% of the silicon substrate's melting threshold fluence are shown in FIGS. 13b, and 13c after an additional about 50 laser shots.

Figure 14A:
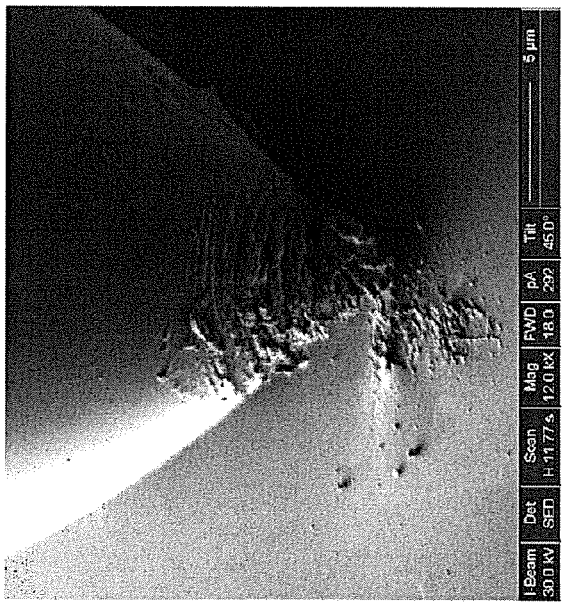
FIG. 14 displays the result of fiber probe based LCVD of Pt in accordance with one embodiment of the present invention.
Figure 14B:
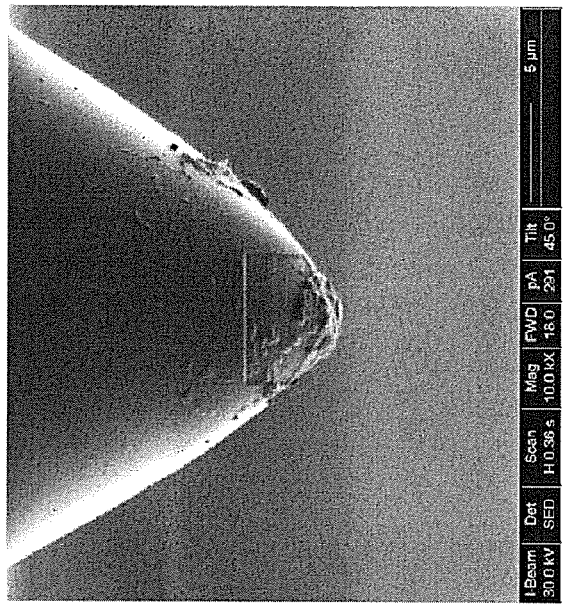

FIG. 14a displays the result of fiber probe based LCVD of Pt by nanosecond laser pulses of about 4-6 ns temporal pulse width, pure 532 nm wavelength, and fluence close to melting threshold of the silicon substrate after about 200 laser shots. Pure 532 nm components did not generate controlled Pt deposit and deposition also occurred on the probe end. Results of in situ probe repair of the contaminated probe by FIB milling are given in FIG. 14b.

Example 5

Pump-and-Probe Time-Resolved Imaging

The use of ultrafast lasers adds remarkable possibilities, since the coupling of the radiative energy with the target material minimizes thermal and thermomechanical loading, thereby leading to tight spatial control of the material modification and avoiding damage to neighboring sensitive structures. The high photon flux femtosecond laser beams can drive absorption notably in otherwise transparent materials.

In order to understand the dynamics of rapid light-matter interaction process, time-resolved TEM imaging by so called pump-and-probe time-resolved imaging technology can further tackle the fundamental light-matter interaction issues. Typically, a single laser beam is split by a beam splitter. One of the split laser components (pump beam) is coupled to the NSOM probes in order to locally illuminate the specimen under TEM imaging apparatus, and the other part of the split laser beam (probe beam) is aligned onto the electron emitting tip structure. Electrons emitted by probe beam illumination are used to obtain a single TEM imaging frame at a specific elapsed time after pump beam illumination. Repetition of similar TEM imaging after precise adjustment of the probe beam path length each repetition can provide a time-resolved TEM imaging of a light-matter interaction event. Since the response of electron emission upon photon injection can be as fast as femtosecond time scale, time-resolved TEM imaging can effectively supply ultrashort time resolution. The extreme temporal resolution achieved by the pump-and-probe technique, and nanometric spatial resolution given by the optical near-field configuration, offers an unprecedented diagnostic tool for nanomaterial configurations when combined with in-situ TEM capability.

Depending on the nature of the specimen under analysis, the pump beam can be further tailored to elucidate detailed interaction mechanisms. For this purpose, the pump beam is again split and combined at desired temporal or spatial overlap, after controlled tailoring of each beam; either frequency multiplied or polarization modified. Arbitrary temporal overlapping is achieved by precise adjustment of the optical path length of each split beam. In-situ TEM monitoring of matter under such a controlled ultrashort laser illumination is expected to provide an entirely new valuable tool to explore detailed mechanisms of light-matter interaction dynamic issues such as quantum mechanical level understanding of fluorescence/emission/Raman dynamics with a wide variety of sample configurations such as fluorescent and/or energy storing molecules, quantum dots, and nanowires, In-situ TEM imaging upon controlled ultrashort laser illumination can be captured by utilizing emitted electrons either from the intrinsic TEM configuration or induced by probe laser beam, depending on the nature of the analysis.

Example 6

In Situ SEM/TEM Detection Capabilities

Since the NSOM probe also serves as an efficient light collector from a nanoscale light source, the same NSOM probe can be used to collect the various emission light components. Light/laser induced emission can be also collected using the secondary probe. This collection capability can be expanded, but is not limited to, general spectroscopic analysis (see, Hwang, D. J., Grigoropoulos, C. P., Yoo, J., and Russo, R. E., "Optical near-field ablation-induced plasma characteristics," *Appl. Phys. Letters*, Vol. 89, 254101 (2006)).

The application of electrical bias between the probe and specimen for either tunneling or electron emission collection can also be achieved (see, Spanakis, E., Chimmalgi, A., Stratakis, E., Grigoropoulos, C. P., Fotakis, C., and Tzanetakis, P., "Atomic force microscopy based, multi-photon, photoelectron emission imaging," *Appl. Phys. Letters*, Vol. 89, 013110 (2006)). Electrical signals at the pA level were established by electron emission between metal coated SPM tips and conductive metal targets upon the application of electrical bias. Irradiation by low power femtosecond laser oscillator radiation enhanced these signals by photoelectron emission that yielded a power law exponent consistent with the nonlinear electron yield by ultrafast radiation. Imaging at the nanoscale was accomplished, differentiating the workfunction and the electronic structure of the target specimen. Subsequent experiments (Stratakis, E., Hwang, D. J., Misra, N., Spanakis, E., Grigoropoulos, C. P., Fotakis, C., and Tzanetakis, P., "Photoelectron emission probing of Si nanowires," *Nano Letters*, Vol. 8, pp. 1949-1953 (2008)) successfully imaged silicon nanowire circuits by both scanning electrical and photoelectron emission microscopy.

The in situ tunneling or electron emission signal supplies valuable real time information on electronic characteristics of a specimen under various TEM monitoring modes. A simple substrate heater can be combined to measure real-time electron emission in conjunction with TEM imaging of detailed structural change. As discussed elsewhere herein, entirely coated probes can act as apertureless NSOM probes either by coupling from inside the probes or by external illumination by secondary light probes, simultaneously allowing collection of electron tunneling and emission signals through the conductive coating. Apertured NSOM probe design based on metal coating to define the aperture at the probe tip can also allow an electron collection path. Furthermore, in reverse mode, electrical bias between the probe tip and the sample structure can induce electroluminescence, and either the NSOM probe or the secondary probe can collect the electroluminescence signal. Light enhanced electron tunneling/emission signals can be also measured in real-time, providing high degree-of-freedom electron spectroscopy capabilities through the variation of electrical bias and coupled laser parameters.

In terms of in situ process monitoring, given the strong dependence of the electron emission on the tip-sample separation, these signals can be used for in situ detection of tip-sample distance as well as in situ monitoring of the process itself. This capability is especially useful for tip-based nanowire/nanotube growth because tracking the top of growing nanostructures is an extremely important factor for their controllable growth. It should be noted that detection of absolute tip-sample gap distance is a very challenging issue in traditional scanning probe microscopy technologies. Typical optical lever sensing or piezo-resistive sensing probes measure deflection of the cantilever holding the sharp tip structures. However, complex interaction mechanism between the tip apex and the sample leads to inconsistent deviation of the tip-sample gap distance from the measurable amount of cantilever deflection.

The optical response of either back reflection through the same tip or of scattered radiation can be used to obtain information on the optical coupling with the target. Since the near-field scales with the aperture, this method will provide an accurate indicator of the position of the growing nanostructure or a still specimen can indicate a nonconductive specimen.

Example 7

Apertureless Femtosecond Laser Nanomachining

Figure 15:
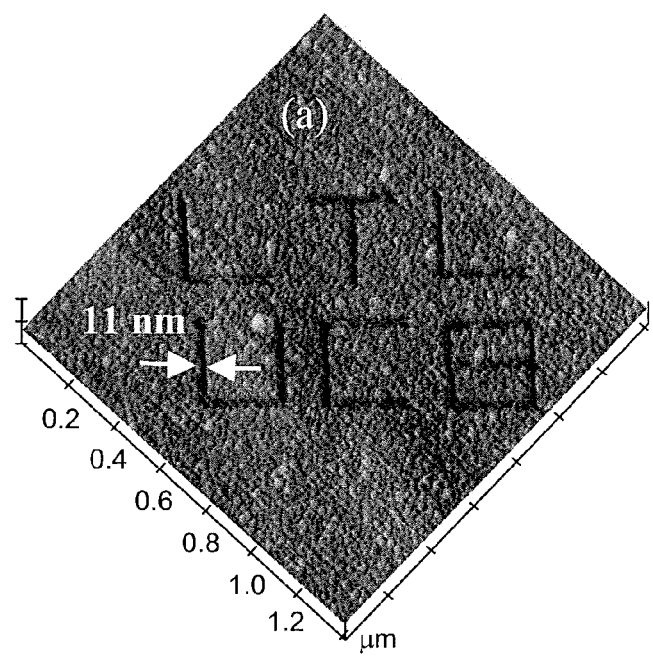
FIG. 15 shows an atomic force microscopy (AFM) image of ablation features on a thin Au film by coupling femtosecond laser pulses at apertureless NSOM configuration in accordance with one embodiment of the present invention.

FIG. 15 shows an atomic force microscopy (AFM) image of nanoscale machining (ablation) features—"LTL" and "UCB," acronyms for Laser Thermal Laboratory and University of California Berkeley—on a thin Au film by coupling femtosecond laser pulses at apertureless NSOM configuration in accordance with the present invention. The line width is about 7-10 nm.

Surface nanostructuring was accomplished with near-IR femtosecond (about 83 fs full width and half maximum (FWHM)) pulses at 800 nm wavelength. Nanomachining experiments were performed at pulse energies in the range of 0.125-3.7 µJ. A two-step attenuation scheme was used to accurately control the pulse energy. Ten percent of the transmitted laser beam from the beam splitter was further attenuated using a half-wave plate and polarizing beam-splitter combination. The polarizing beam splitter transmits the P-polarization component that is used for structuring. The beam was then focused onto the AFM probe tip using a 175 mm positive lens giving a 1/e2 beam spot diameter of about 74 µm, measured with the knife-edge technique. Laser beam alignment was accomplished by simultaneously viewing the tip from the top and the side using combinations of a 12× zoom lens, 10× long focal length objective, and a CCD camera. The laser beam was aligned at a grazing angle of incidence to the sample surface. Imaging was performed with a commercial multi-mode AFM (Digital Instruments) operated in the contact mode. However, constant tip-sample separation was maintained during nanomachining by using a commercial nanolithography software (Digital Instruments) that disables tip position feedback signals. Commercially available silicon probes with nominal tip radius of curvature equal to 5-10 nm and about 25-nm-thick gold films (with root-mean-square roughness of about 0.95, extracted from AFM measurements) sputtered on Si(100) substrates were used in the experiments.

The minimum feature size observed during these nanomachining experiments had a lateral dimension less than 10 nm. A single tip was used for a number of these nanostructuring experiments without any noticeable damage. With higher fluence, penetration into the underlying glass substrate can be achieved for subsequent lithography steps.

Example 8

Nanoscale Crystallization

Figure 16:
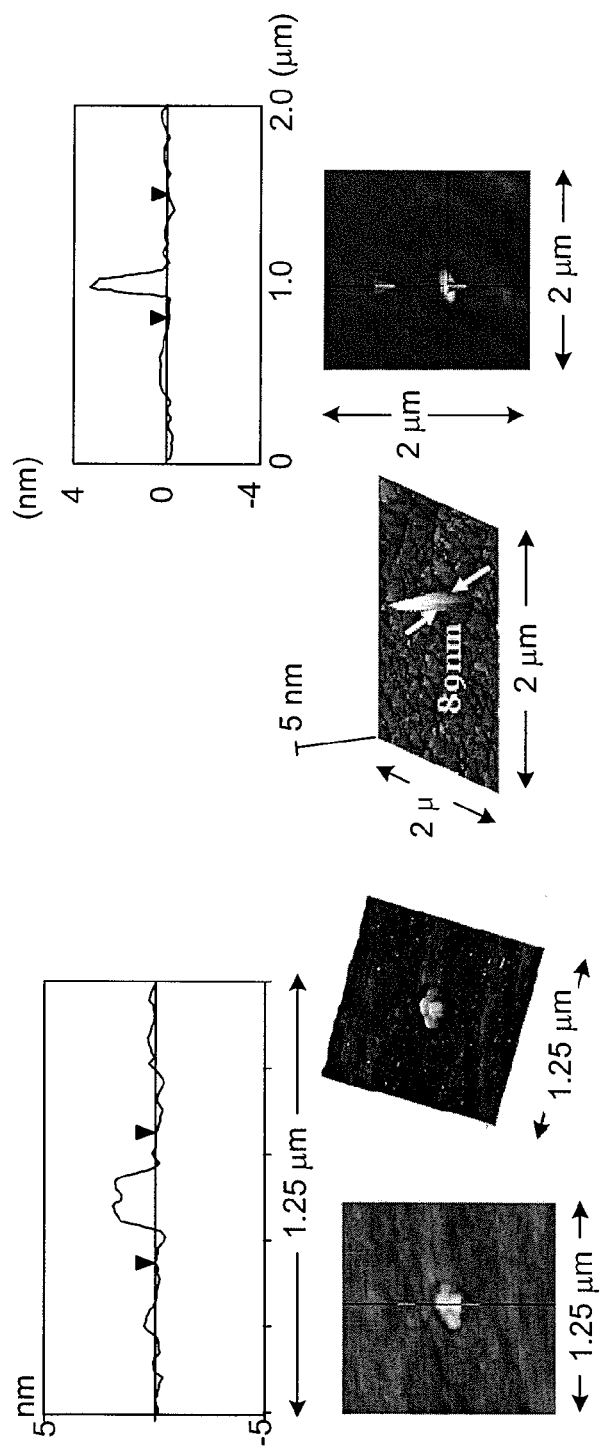
FIG. 16 shows that both the apertured and apertrureless NSOM schemes can be also utilized to drive nanoscale crystallization by depicting nanoscale crystallization of 20 nm a-Si films in accordance with one embodiment of the present invention.

FIG. 16 shows that both the apertured and apertureless NSOM schemes can be also utilized to drive nanoscale crystallization. Precise control of crystallization of amorphous silicon films can produce clusters and even isolated nanocrystals. FIG. 16 shows nanoscale crystallization of 20 nm a-Si films. The left feature has been generated by the apertured NSOM probe and the right feature, by the apertureless NSOM probe.

Example 9

Figure 17:
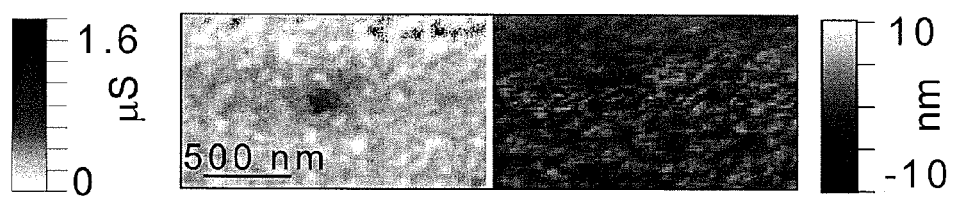
FIG. 17 depicts C-AFM conductance (left) and height (right) images of a feature resulting from near-field low-power pulsed-laser annealing of hydrogenated $Ga_{0.96}Mn_{0.04}As$ using a nanosecond laser pulses in accordance with one embodiment of the present invention.

Fabrication of Semiconductor Quantum Dots: Ferromagnetic Semiconductor Quantum Dots for Nanospintronics The emerging field of semiconductor spintronics has the potential to revolutionize conventional electronics by harnessing the spin degree of freedom of charge carriers in semiconductors (see, S. A. Wolf, D. D. Awschalom, R. A. Buhrman, J. M. Daughton, S. von Molnar, M. L. Roukes, A. Y. Chtchelkanova, and D. M. Treger, "Spintronics: a spin-based electronics vision for the future," Science, Vol. 294, 1488 (2001). Wolf, 2001). Ferromagnetic semiconductors such as $Ga_{1-x}Mn_xAs$ are expected to play an important role due to the ability to tune both their electrical and magnetic properties and their potential for the injection and filtering of spin-polarized carriers. Recently, the local depassivation of hydrogenated $Ga_{1-x}Mn_xAs$ by low-power NSOM pulsed-laser annealing was demonstrated (see, Farshchi, R., Dubon, O. D., Hwang, D. J., Misra, N., Grigoropoulos, C. P., Ashby, P., 2008, "Laser Activation of Ferromagnetism in Hydrogenated Ga1-xMnxAs," Applied Physics Letters, Vol. 92, No. 012517). FIG. 17 shows a dot imaged by conductance AFM (C-AFM). The occurrence of an electrically conducting dot with almost no topography indicates dehydrogenation and from additional supporting evidence indicates ferromagnetic activation of Mn without structural damage. FIG. 17 depicts C-AFM conductance (left) and height (right) images of a feature resulting from near-field low-power pulsed-laser annealing of hydrogenated $Ga_{0.96}Mn_{0.04}As$ using a nanosecond laser pulses.

Conclusion

The invention has been described herein in considerable detail to provide those skilled in the art with information relevant to apply the novel principles and to construct and use such specialized components as are required. However, it is to be understood that the invention can be carried out by different equipment, materials and devices, and that various modifications, both as to the equipment and operating procedures, can be accomplished without departing from the scope of the invention itself.

We claim:

1. A method for performing nanoscale material processing of a material target, comprising:
   a) providing a target in an electron beam instrument;
   b) providing a laser configured to produce laser radiation having a wavelength;
   c) providing a probe less than one wavelength away from the target in a near field region;
   d) using the laser to provide a laser radiation pulse to the probe, thus causing the probe to emit energy;
   e) allowing the energy emitted from the probe to interact with one or more of the target and precursor molecules provided between the probe on the target, such that the target is processed; and
   further comprising in situ monitoring of the target with a non-diffraction limited technique as operations a) to e) are being performed.

2. The method of claim 1 wherein a structure with a size less of than 100 nm results from the material processing.

3. The method of claim 1 wherein the target is a substrate.

4. The method of claim 1 wherein the target is previously deposited material.

5. The method of claim 1 wherein using the laser to provide a laser radiation pulse to the probe comprises directing the laser pulse through the probe.

6. The method of claim 1 wherein using the laser to provide a laser radiation pulse to the probe comprises directing the laser pulse to the probe from outside the probe.

7. The method of claim 1 wherein the energy emitted from the probe is in the form of photons.

8. The method of claim 1 wherein the energy emitted from the probe is thermal energy.

9. The method of claim 1 wherein the material processing comprises a method for depositing material onto a target, comprising:
   f) providing precursor molecules between the probe and the target;
   g) allowing the precursor molecules to interact with the energy emitted from the probe; and
   h) dissociating the precursor molecules in the near field region, thus depositing material onto the target.

10. The method of claim 9 wherein depositing material comprises depositing localized submicron and nanometer structures.

11. The method of claim 9, further comprising applying a bias voltage between the probe and the target before operation g).

12. The method of claim 1 wherein the material processing is selected from the group consisting of additive, subtractive and modification processing and combinations thereof.

13. The method of claim 12 wherein the additive material process is selected from the group consisting of chemical vapor deposition and selective self-assembly and combinations thereof.

14. The method of claim 12 wherein the subtractive material process is selected from the group consisting of ablation, machining and chemical etching and combinations thereof.

15. The method of claim 12 wherein the modification material process is selected from the group consisting of phase transformation and doping and combinations thereof.

16. A method of depositing material onto a target, comprising:
   a) providing a target in an electron beam instrument;
   b) providing precursor molecules adjacent the target;
   c) providing a series of laser pulses having a particular wavelength through a probe located less than one wavelength from the target;
   d) allowing the laser pulses to pass through at least some of the precursor molecules, thus dissociating the precursor molecules and depositing material onto the target; and
   further comprising in situ monitoring of the target with a non-diffraction limited technique as operations a) to d) are being performed.

17. The method of claim 16 wherein the laser pulse is produced by a near field scanning optical microscope.

18. A method of depositing material onto a target, comprising:
   a) providing a target in an electron beam instrument;
   b) providing precursor molecules adjacent the target;
   c) providing a series of laser pulses having a particular wavelength to the outside of a probe located less than one wavelength from the target; and
   d) allowing a thermal field generated between the probe and the target to dissociate at least some of the precursor molecules, thus depositing material onto the target; and
   further comprising in situ monitoring of the target with a non-diffraction limited technique as operations a) to d) are being performed.

19. The method of claim 18 wherein the laser pulse is produced by a near field scanning optical microscope.

20. The method of claim 18 wherein dissociating the precursor molecules occurs in a near field region of the laser pulse.

21. A method of fabricating a submicron and nanometer structure, comprising:
   providing a substrate;
   depositing a catalytic dot onto the substrate by a method comprising the steps of:
   a) providing a substrate;
   b) providing a laser configured to produce laser radiation having a wavelength;
   c) providing a probe less than one wavelength away from the substrate;
   d) providing precursor molecules between the probe and the substrate;
   e) using the laser to provide a laser radiation pulse to the probe, thus causing the probe to emit energy;
   f) allowing the precursor molecules to interact with the energy emitted from the probe; and
   g) dissociating the precursor molecules in the near field region, thus depositing the catalytic dot; and
   growing the structure onto the catalytic dot by continuing steps e through g while moving the probe away from the dot as material is deposited, maintaining a distance of less than one wavelength between the probe and the deposited material.

22. The method of claim 21 wherein the method is conducted in an electron beam instrument and the method further comprises in situ monitoring of at least one of the substrate and the structure during performance of the method.

* * * * *